(12) United States Patent
Yoshinaka

(10) Patent No.: US 6,373,413 B1
(45) Date of Patent: Apr. 16, 2002

(54) DATA DECODING APPARATUS AND DATA DECODING METHOD

(75) Inventor: Tadaaki Yoshinaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/579,732

(22) Filed: May 26, 2000

(30) Foreign Application Priority Data

May 27, 1999 (JP) .......................................... 11-147694

(51) Int. Cl.⁷ ............................................ H03M 13/00
(52) U.S. Cl. .......................... 341/94; 714/795; 375/341
(58) Field of Search ................... 341/94, 155; 714/794, 714/795; 375/341

(56) References Cited

U.S. PATENT DOCUMENTS

| | | | |
|---|---|---|---|
| 5,581,568 A | * 12/1996 | Togami | 371/743 |
| 5,809,071 A | * 9/1998 | Kobayashi et al. | 375/229 |
| 5,867,542 A | * 2/1999 | Iwamatsu et al. | 375/354 |
| 5,881,039 A | * 3/1999 | Sano et al. | 369/59 |
| 6,097,769 A | * 8/2000 | Sayiner et al. | 375/341 |

\* cited by examiner

Primary Examiner—Peguy Jeanpierre

(74) Attorney, Agent, or Firm—Frommer Lawrence & Haug LLP; William S. Frommer

(57) ABSTRACT

This invention relates to a data decoding apparatus and data decoding method which perform maximum likelihood decoding by means of a simple construction, and which can be applied for example to a videotape recorder or optical disk device. In the data decoding apparatus or data decoding method according to this invention, a logic level inversion timing during one clock interval is detected from an input signal, a provisional identification result of identifying the input signal is corrected by effectively one clock identification error, the number of state transitions which can be obtained from the input signal is limited based on this corrected provisional identification result, and the most probable state transition of these limited state transitions is detected to output an input signal identification result. Further, in the data decoding apparatus or data decoding method according to this invention, a provisional identification result is obtained by identifying an input signal by effectively one clock identification error, a logic level inversion interval is corrected when a logic level inversion interval occurs in a shorter interval than a permitted logic level inversion interval in the input signal, the number of state transitions which can be obtained from the input signal is limited based on this corrected provisional identification result, and the most probable state transition of these limited state transitions is detected to output an input signal identification result.

20 Claims, 20 Drawing Sheets

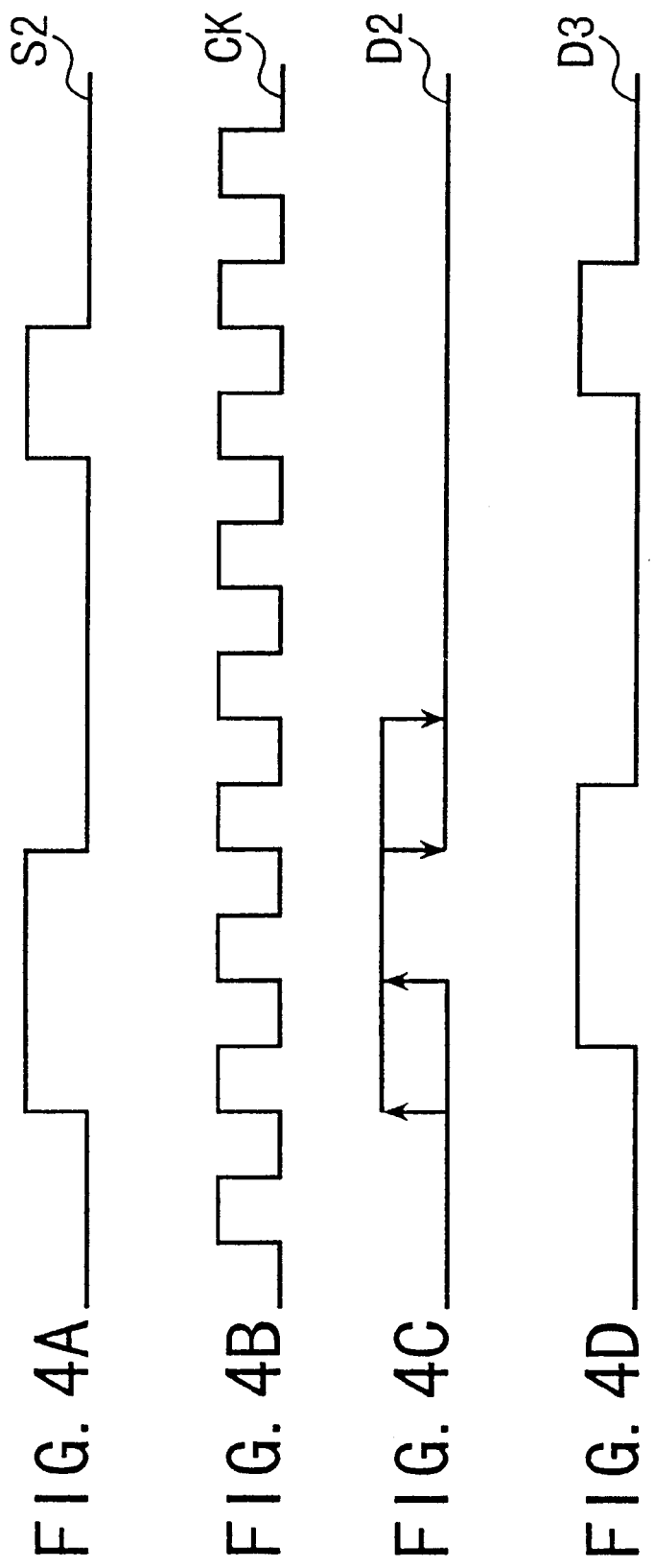

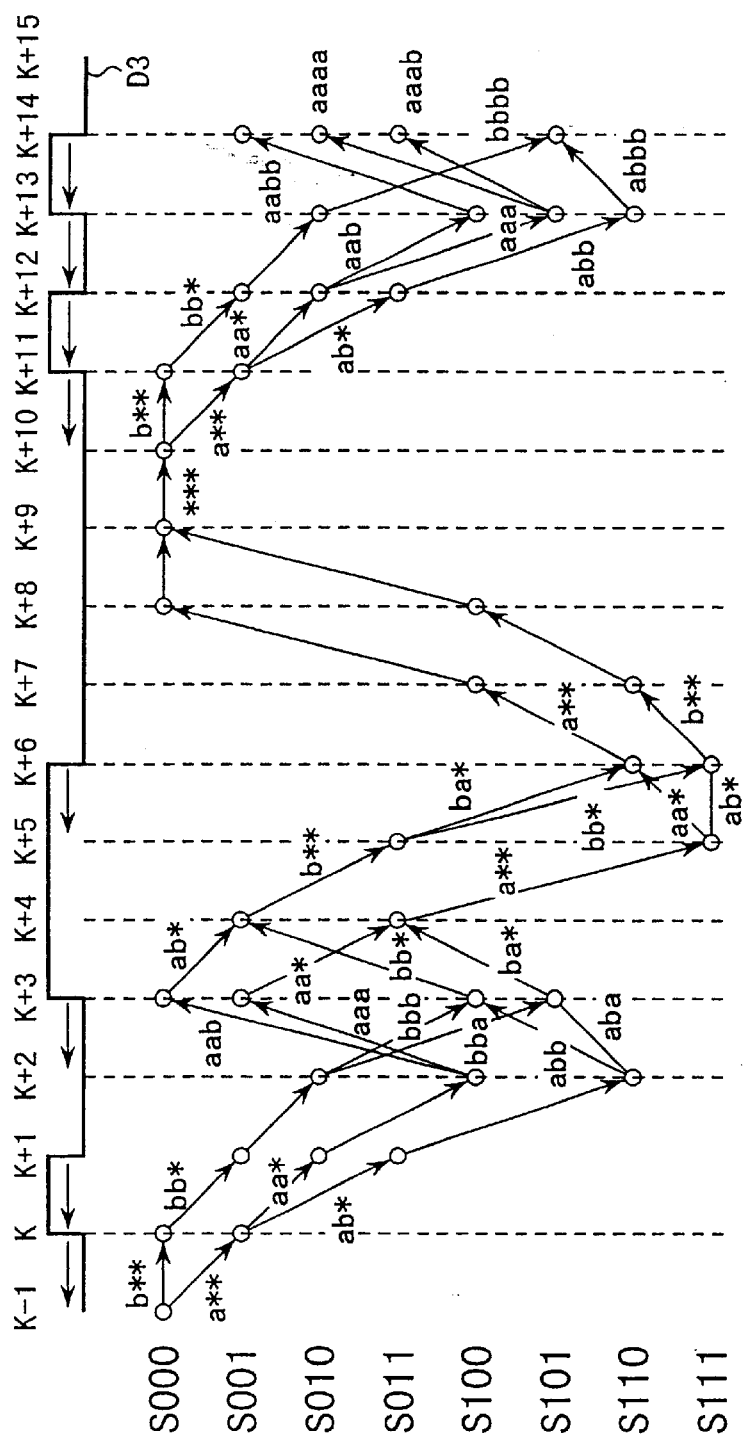

FIG. 14
(PRIOR ART)

| PREVIOUS INPUT | | | STATE | INPUT | OUTPUT | NEXT STATE |
|---|---|---|---|---|---|---|
| a[k-3] | a[k-2] | a[k-1] | b[k-1] | a[k] | c[k] | b[k] |
| 0 | 0 | 0 | S000 | 0 | 0 | S000 |
| 0 | 0 | 0 | S000 | 1 | 1 | S001 |
| 0 | 0 | 1 | S001 | 0 | 1 | S010 |
| 0 | 0 | 1 | S001 | 1 | 2 | S011 |
| 0 | 1 | 0 | S010 | 0 | -1 | S100 |
| 0 | 1 | 0 | S010 | 1 | 0 | S101 |
| 0 | 1 | 1 | S011 | 0 | 0 | S110 |
| 0 | 1 | 1 | S011 | 1 | 1 | S111 |
| 1 | 0 | 0 | S100 | 0 | -1 | S000 |
| 1 | 0 | 0 | S100 | 1 | 0 | S001 |
| 1 | 0 | 1 | S101 | 0 | 0 | S010 |
| 1 | 0 | 1 | S101 | 1 | 1 | S011 |
| 1 | 1 | 0 | S110 | 0 | -2 | S100 |
| 1 | 1 | 0 | S110 | 1 | -1 | S101 |
| 1 | 1 | 1 | S111 | 0 | -1 | S110 |
| 1 | 1 | 1 | S111 | 1 | 0 | S111 |

DATA DECODING APPARATUS AND DATA DECODING METHOD

BACKGROUND OF THE INVENTION

1. Field of the Invention

This invention relates to a maximum likelihood decoding technique which, for example, is suitable for application to a videotape recorder or optical disk device.

2. Description of the Related Art

In the prior art, in videotape recorders and optical disk devices, digital signals which are recorded at high density are faithfully reproduced by processing reproduced signals by Viterbi decoding.

In Viterbi decoding, input data is processed by defining n types of state, determined by intercode interference, by a combination of immediately preceding input data, and updating these n types of state to the following n types of state each time the input data changes. Specifically, if the intercode interference length is m, these n states are determined by the immediately preceding m-1 bits, e.g., if the input data is logic 1 or logic 0 serial data, there are $n=2^{(m-1)}$ states.

Concerning the n states so defined, assuming that the noise contained in the reproduced signal is a Gaussian distribution and taking the value of the reproduced signal corresponding to each state when there is no noise present as a reference amplitude value, the likelihood or probability of making a transition to each state is a value obtained by raising the difference between the reference amplitude value and the actual reproduced signal to a power of two (which is the distance from the reference amplitude value), and summing this square value until there is a transition to each state. In this way, in Viterbi decoding, sums are calculated respectively for paths via which transitions from the immediately preceding n states to the following states are possible, and assuming that transitions occur for paths which have the highest likelihood (smallest sum value) from the calculated results, the n states are updated to the following n states, and the history and likelihood of the identification values in each state are also updated.

By successively detecting the most likely state transitions in this way, the history up to plural preceding bits are merged into one history at a predetermined stage, and the identification result up to that time is thereby specified. This is how Viterbi decoding identifies a reproduced signal.

In Viterbi decoding which processes reproduced signals in this way, if the noise superimposed on the reproduced signal is random noise, maximum use is made of the signal power of the reproduced signal to identify the reproduced signal, and this permits improvement of the error rate as compared with the decoding method where the reproduced signal is decoded by comparing it with a predetermined threshold value for each bit.

FIG. 14 is a table showing state transitions in an EPR (Extended Partial Response) 4 equalization for a recorded signal which allows a logic level inversion for one clock interval in a continuous serial bit sequence, i.e., for a recorded signal wherein d is not limited. The EPR4 is PR(1, 1, -1, -1), and intercede interference occurs up to three bits later relative to one input data.

Therefore in this combination, the state transition (output) due to the following input data is uniquely determined by the history of input data up to three previous bits. Herein, a[k] represents the input data, and a[k-1], a[k-2], a[k-3] are respectively input data one clock, two clocks and three clocks prior to the input data a[k]. A state b[k-1] due to this input data a[k-1], a[k-2], a[k-3] is shown by the values of a code S and the input data a[k-1], a[k-2], a[k-3]. In this case, in a state (S000) for example, if an input a[k] of value 0 is input, an output c[k] of value 0 is obtained, and the state b[k] changes to (S000).

In this case, as there is no limit d=1, 8 states (S000)–(S111) are obtained corresponding to combinations of three successive input data, and the output signal c[k] has five reference amplitude values -2, -1, 0, 1, 2. If these relations are represented by a trellis diagram, they appear as shown in FIG. 15.

In this case, in Viterbi decoding, from a trellis diagram drawn by repeating FIG. 15, the branch metric of the difference between the reproduced signal and the reference amplitude value is summed, and the path having the least value of this sum is selected to decode the input signal.

FIG. 16 is a block diagram showing a reproduction device to which this type of Viterbi decoder is applied. In a reproduction device 1, a reproduction equalizer 2 performs Nyquist equalization and outputs a reproduction signal RF to permit reproduction of a clock by the reproduction signal RF. A binarizing circuit 3 binarizes the equalized signal output by this reproduction equalizer 2 so as to output a binarized signal S2.

A PLL circuit 4 which operates based on this binarized signal S2 as a reference, reproduces and outputs a clock CK from the reproduction signal RF. An analog/digital (A/D) conversion circuit 5 sequentially performs analog/digital conversion on the reproduction signal RF based on this clock CK, and outputs a digital reproduced signal. By performing computational processing on this digital reproduced signal, a reproduction equalizer 6 generates and outputs an EPR4 equalized signal, for example, and a Viterbi decoder 7 processes the EPR4 equalized signal from this reproduction equalizer 6 to output a binary decoded output D1 which is a recorded signal recorded on a recording medium. Hence, this reproduction device 1 uses the technique of PRML (Partial Response Maximum Likelihood) to reproduce the binary decoded output D1.

FIG. 17 is a block diagram showing this Viterbi decoder 7. In this Viterbi decoder 7, a branch metric calculator 7A receives a digital reproduction signal DRF due to the EPR4 equalized signal, and by performing the following computational processing on each sample value of the digital reproduction signal DRF, calculates and outputs branch metrics BM0[k]–BM4[k] relative to reference amplitude values. Herein, the branch metrics BM0[k]–BM4[k] are differences between values of the reproduced signal corresponding to each state when no noise is present (reference amplitude values which in this case are the five values 2, 1, 0, -1, -2) and a real reproduced signal level Z[k] raised to the power of 2, and are Euclidian distances of the reproduced signal level relative to the reference amplitude values.

$$BM0[k]=(Z[k]-2)^2$$
$$BM1[k]=(Z[k]-1)^2$$
$$BM2[k]=(Z[k])^2$$
$$BM3[k]=(Z[k]+1)^2$$
$$BM4[k]=(Z[k]+2)^2 \quad (1)$$

Specifically, the branch metric calculator 7A comprises plural subtractor circuits which compute the reference amplitude values from the digital reproduction signal DRF, and plural multiplier circuits which raise the subtraction results to the power of 2.

A branch metric processing circuit 7B performs the computations of the following equations respectively in metric calculators 7BA–7BH using the branch metrics BM0[k] –BM4[k] output by the branch metric calculator 7A, and thereby calculates the metrics (S000, k)–(S111, k) which are sum values of the branch metrics input to each state. Herein, min{a, b} is processing which selects the least value of a, b.

$$L(S000, k)=\min \{1(S000, k-1)+BM2[k], (S100, k-1)+BM3[k]\} \quad (2\text{-}1)$$

$$L(S001, k)=\min \{1(S000, k-1)+BM1[k], (S100, k-1)+BM2[k]\} \quad (2\text{-}2)$$

$$L(S010, k)=\min \{1(S001, k-1)+BM1[k], (S101, k-1)+BM2[k]\} \quad (2\text{-}3)$$

$$L(S011, k)=\min \{1(S001, k-1)+BM3[k], (S101, k-1)+BM1[k]\} \quad (2\text{-}4)$$

$$L(S100, k)=\min \{1(S010, k-1)+BM3[k], (S110, k-1)+BM4[k]\} \quad (2\text{-}5)$$

$$L(S101, k)=\min \{1(S010, k-1)+BM2[k], (S110, k-1)+BM3[k]\} \quad (2\text{-}6)$$

$$L(S110, k)=\min \{1(S011, k-1)+BM2[k], (S111, k-1)+BM3[k]\} \quad (2\text{-}7)$$

$$L(S111, k)=\min \{1(S011, k-1)+BM1[k], (S111, k-1)+BM2[k]\} \quad (2\text{-}8)$$

The branch metric processing circuit 7B also outputs determining results SEL0-7 due to the metric calculators 7BA—7BH.

FIG. 18 is a block diagram showing the detailed construction of the branch metric calculator 7B. In the branch metric calculator 7B, the metric calculators 7BA–7BF have an identical circuit layout excepting that the inputs/outputs are set corresponding to the state transitions shown in FIG. 15, therefore here only the metric calculator 7BA corresponding to the state S000 will be described and identical parts of the description will be omitted.

Specifically, in the calculator 7BA which calculates a metric for the transition to the state (S000), an adder circuit 10 adds the metric L(S000, k−1) of the state (S000) calculated one clock previously in this first metric calculator 7BA, and the branch metric BM2[k] calculated by the branch metric calculator 7A, and outputs the result. Thus, the adder circuit 10 outputs an addition result corresponding to the first term on the right-hand side of equation (2-1).

An adder circuit 11 adds the metric L(S100, k−1) of the state (S100) calculated one clock previously in the fifth metric calculator 7BE, and the branch metric BMB3[k] calculated by the branch metric calculator 7A, and outputs the result. Thus, the adder circuit 11 outputs an addition result corresponding to the second term on the right-hand side of equation (2-1).

A comparator circuit 12 outputs the result of comparing output data from the adder circuits 10 and 11. Thus, the comparator circuit 12 determines from which of the states (S000) and (S100) a transition to the state (S000) is most likely (probable), and outputs this determining result SEL0.

A selector 13 selects and outputs the addition result of the adder circuits 10, 11 according to the determining result SEL0 of the comparator circuit 12, and thereby outputs the computational processing result on the right-hand side of equation (2-1). A latch (D)14 delays the computational processing result by one clock period by latching the selection output of this selector 13, after which it is output.

A path memory unit 7C (FIG. 17) generates the binary decoded output D1 by processing the calculation results of the branch metric calculator 7B respectively by path memories 7CA–7CH, and outputs the result.

FIG. 19 and FIG. 20 are block diagrams showing part of the path memory unit 7C. In FIG. 19, the path memory 7CA comprises a predetermined number of latches (number of latches equal to or greater than the number of merging paths, generally a number of latches equivalent to 16 to 32 bits) 16A–16N connected in series, and selectors 17A–17M which selectively output the history of the fifth path memory 7CE or the history of the immediately preceding latch, are disposed between these latches 16A–16N.

These selectors 17A–17M change over operation according to the determining result SEL0. In this way, in the corresponding metric calculator 7BA, if the metric from the fifth state (S100) is selected, the history of the path memory 7CE is selected and output. On the other hand, if the metric from the first state (S000) is selected, a self-history held in the immediately preceding latch is selected and output. The first latch 16A latches corresponding fixed data of value 0 for both of these transitions, and the last latch 16N outputs the binary decoded output D1.

The path memory 7CH of the eighth state (S111) is identical to the first path memory 7CA excepting that in the construction shown in FIG. 19, the history of the fourth path memory 7CD is selectively received instead of the history of the fifth path memory 7CE, fixed data of value 1 is latched by the first latch 16A instead of the fixed data of value 0 corresponding to the received history, the destination to which the history is sent is different, and the change-over signal of the selectors 17A–17M is different.

On the other hand, the second path memory 7CB (FIG. 20) comprises the latches 16A–16N of identical number to those of the path memory 7CC, and the selectors 17A–17M which selectively output the history of the first path memory 7CA or the history of the fifth path memory 7CE, disposed between the latches 16B-16N excluding the first latch 16A.

These selectors 17A–17M change over operation according to the determining result SEL1, and consequently in the corresponding metric calculator 7BB, if the metric from the first state (S000) is selected, the history of the path memory 7CA is selected an output. On the other hand, if the metric from the fifth state (SL00S) is selected, the history of the path memory 7CE is selected and output. The first latch 16A latches corresponding fixed data of value 1 for both of these transitions. The last latch 16N outputs the binary decoded output D1.

The path memory 7CC of the third state (S010) is identical to the second path memory 7CB excepting that in the construction shown in FIG. 20, the history of the second or sixth path memory 7CB is selectively received instead of the history of the first or fifth path memory 7CA or 7CE, fixed data of value 0 is latched by the first latch 16A instead of the fixed data of value 1 corresponding to the received history, the destination to which the history is sent is different, and the change-over signal of the selectors 17A–17M is different.

The path memory 7CD of the fourth state (S011) is identical to the second path memory 7CB excepting that in the construction shown in FIG. 20, the history of the second or sixth path memory 7CB or 7CF is selectively received instead of the history of the first or fifth path memory 7CA or 7CE, the destination to which the history is sent is different, and the change-over signal of the selectors 17A–17M is different.

The path memory 7CE of the fifth state (S100) is identical to the second path memory 7BA excepting that in the construction shown in FIG. 20, the history of the third or seventh path memory 7CC or 7CD is selectively received instead of the history of the first or fifth path memory 7CA or 7CE, fixed data of value 0 is latched by the first latch 16A instead of the fixed data of value 1 corresponding to the received history, the destination to which the history is sent is different, and the change-over signal of the selectors 17A–17M is different.

The path memory 7CF of the sixth state (S101) is identical to the second path memory 7CB excepting that in the construction shown in FIG. 20, the history of the third or seventh path memory 7CC or 7CG is selectively received instead of the history of the first or fifth path memory 7A or 7CE, the destination to which the history is sent is different, and the change-over signal of the selectors 17A–17M is different.

The path memory 7CG of the seventh state (S110) is identical to the second path memory 7CB excepting that in the construction shown in FIG. 20, the history of the fourth or eighth path memory 7CD or 7CH is selectively received instead of the history of the first or fifth path memory 7CA or 7CE, fixed data of value 0 is latched by the first latch 16A instead of the fixed data of value 1 corresponding to the received history, the destination to which the history is sent is different, and the change-over signal of the selectors 17A–17M is different.

Due to these constructions, when the path memories 7CA–7CH receive a history of a predetermined number of stages, an identical history is held in the corresponding latch. In the Viterbi decoder 7, the binary decoded output D1 is therefore obtained from the last latch 16N of any of the path memories 7CA–7CG.

However, in this type of recording and reproduction system, the ability to identify reproduced data can be enhanced by increasing the intercode interference length m. As described above, the number of states S due to the intercede interference length m can be represented by $2^{(m-1)}$, therefore the number of states increases in terms of indices and parameters when the intercede interference length m is increased. On the other hand in the Viterbi decoder 7 of the prior art, the same number of metric calculators 7BA–7BH and path memories 7CA–7CH as the number of states is required, and when the number of states increases, the construction becomes exceedingly complex.

In this type of recording and reproduction system, an intercede interference length m of a certain length had to be tolerated due to the scale of the circuit.

SUMMARY OF THE INVENTION

It is therefore an object of this invention, which was conceived in view of the above problems, to provide a data decoding apparatus and data decoding method which can realize maximum likelihood decoding by a simple construction.

To resolve the above problems, in the data decoding apparatus or data decoding method according to this invention, a logic level inversion timing during one clock interval is detected from an input signal, a provisional identification result of identifying the input signal is corrected by effectively one clock identification error, the number of state transitions which can be obtained from the input signal is limited based on this corrected provisional identification result, and the most probable state transition of these limited state transitions is detected to output an input signal identification result.

Further, in the data decoding apparatus or data decoding method according to this invention, a provisional identification result is obtained by identifying an input signal by effectively one clock identification error, a logic level inversion interval is corrected when a logic level inversion interval occurs in a shorter interval than a permitted logic level inversion interval in the input signal, the number of state transitions which can be obtained from the input signal is limited based on this corrected provisional identification result, and the most probable state transition of these limited state transitions is detected to output an input signal identification result.

BRIEF DESCRIPTION OF THE DRAWINGS

FIG. 4A–FIG. 4D are signal waveform diagrams used in describing the signal waveform detecting circuit in the provisional identifier of FIG. 2.

FIG. 5A and FIG. 5B are state transition diagrams showing transitions of the digital reproduction signal.

FIG. 14 is a table showing state transitions in EPR4.

DETAILED DESCRIPTION OF THE PREFERRED EMBODIMENTS

This invention will now be described in detail referring to the appended drawings as appropriate.

(1) Embodiment 1
(1-1) Construction of first embodiment

Figure 1:
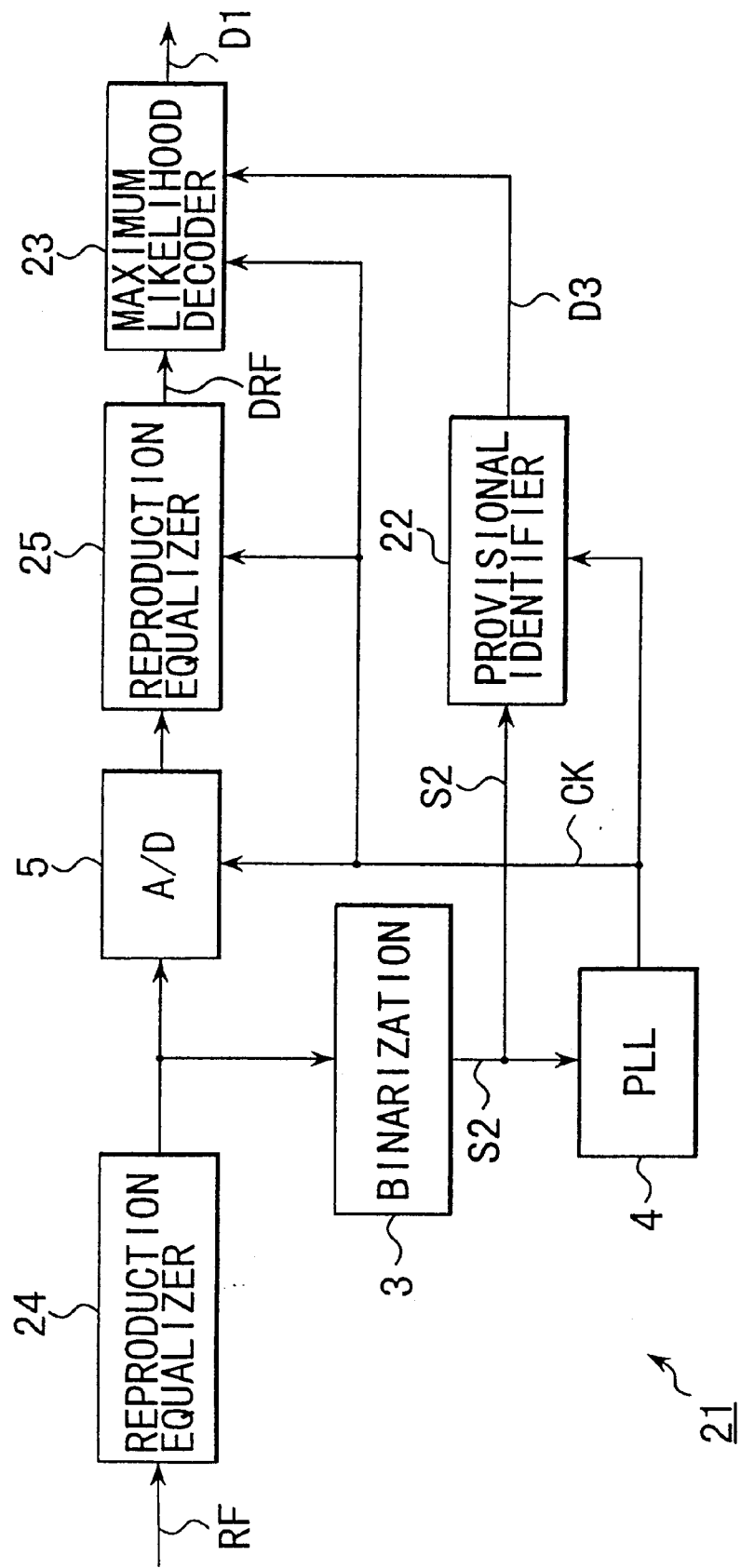
FIG. 1 is a block diagram showing a reproduction apparatus according to a first embodiment of this invention.
Figure 16:
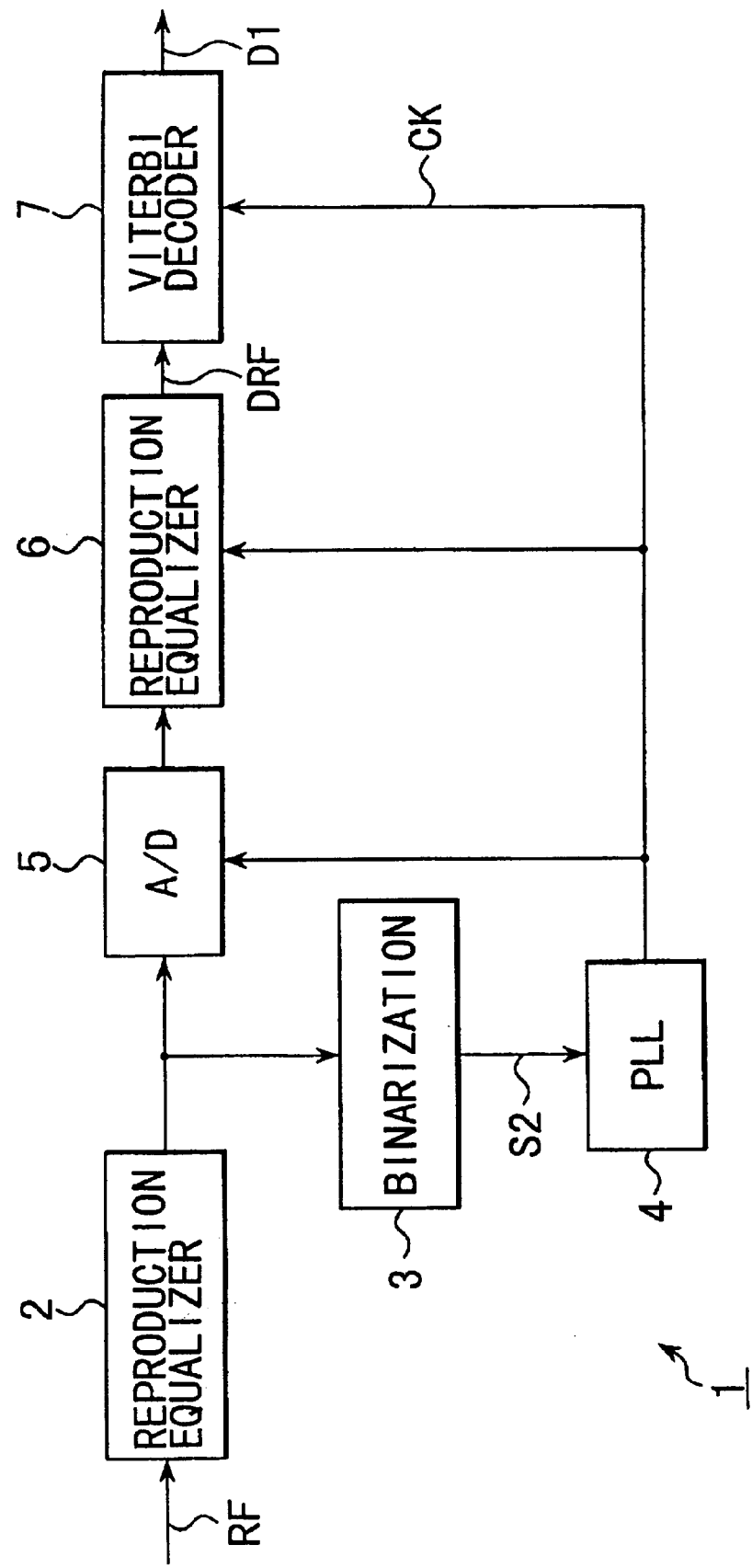
FIG. 16 is a block diagram showing a reproduction apparatus using a prior art Viterbi decoder.
Figure 17:
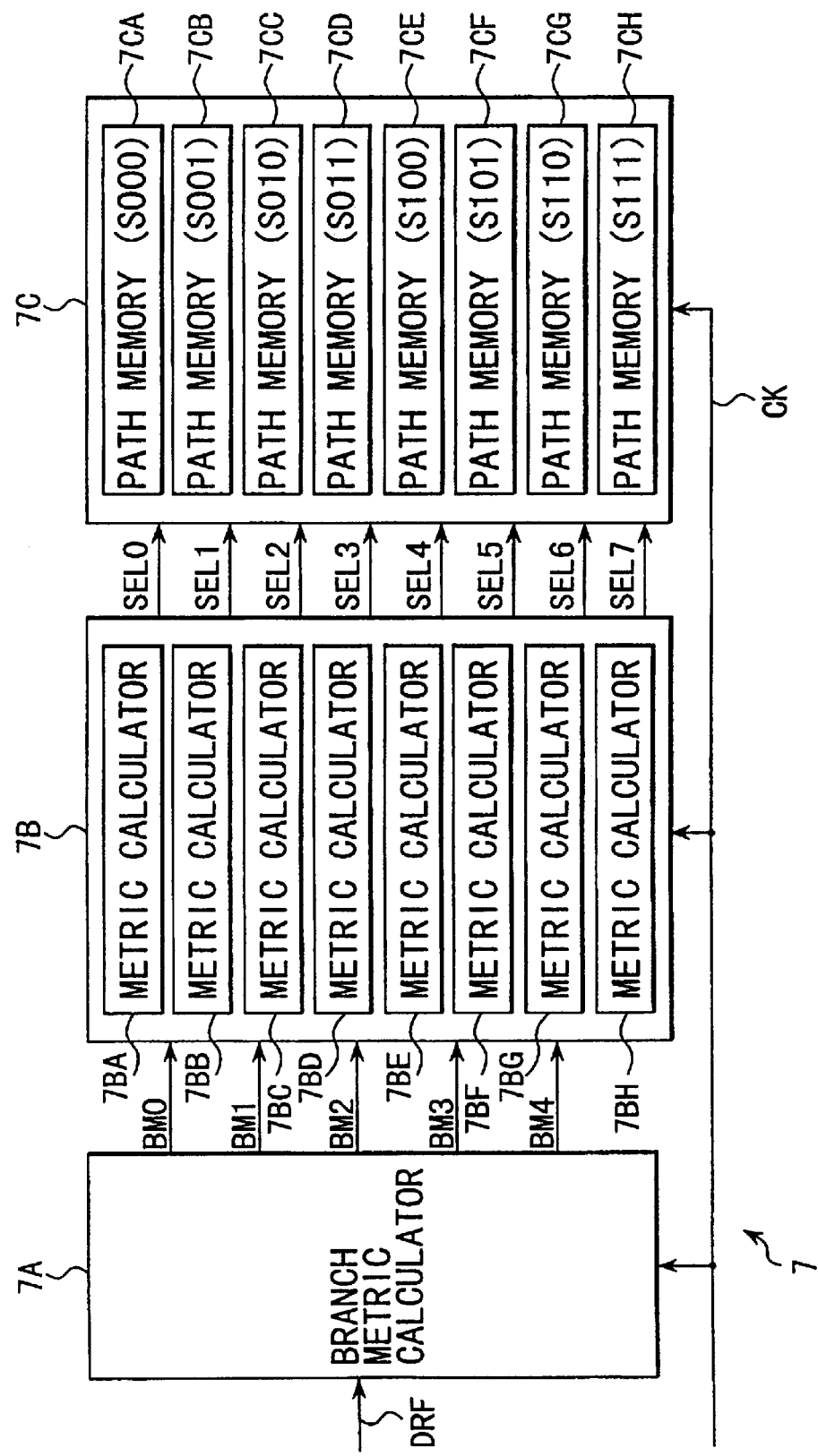
FIG. 17 is a block diagram showing the Viterbi decoder of FIG. 16.
Figure 18:
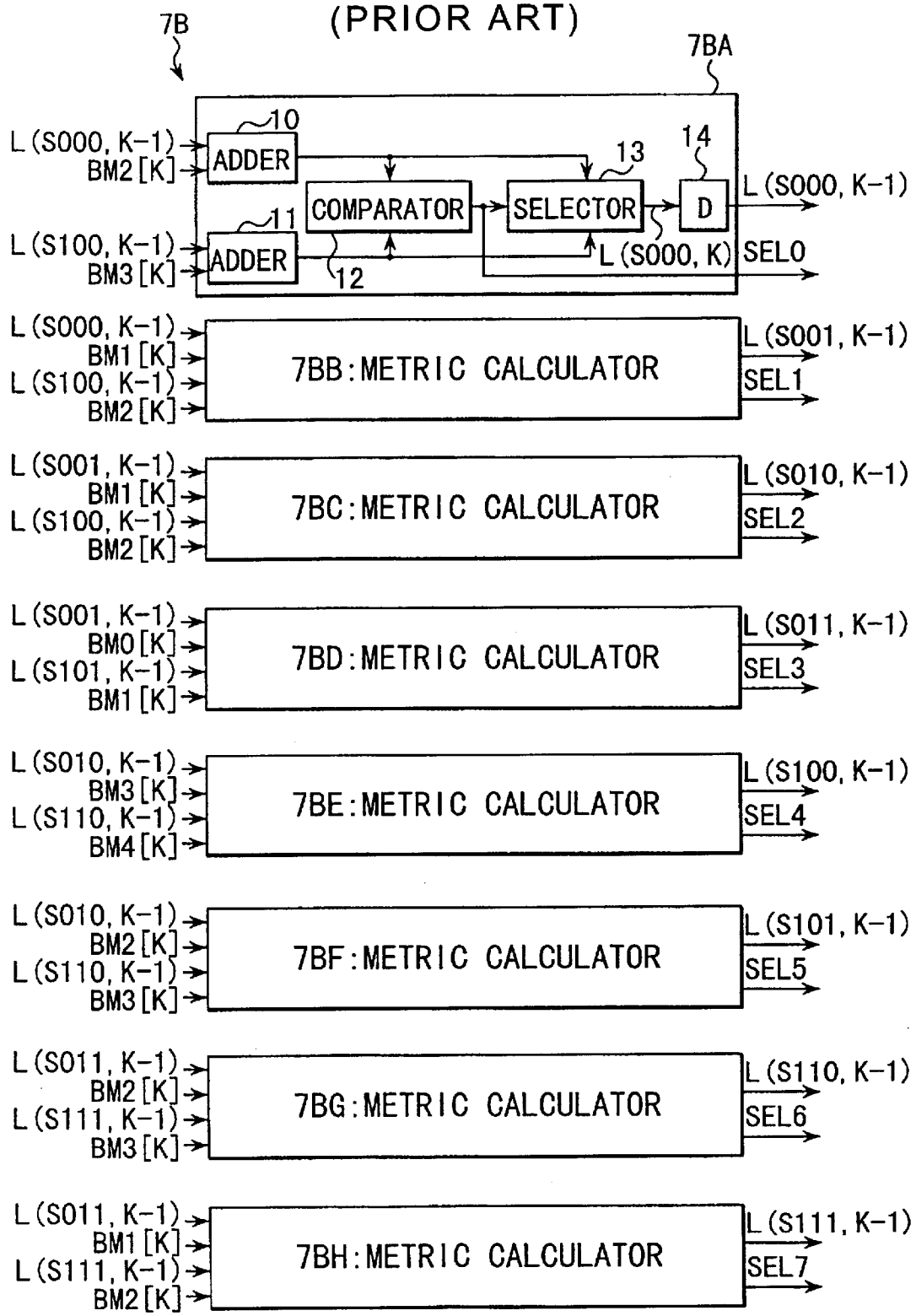
FIG. 18 is a block diagram showing a branch metric calculator in the Viterbi decoder of FIG. 17.
Figure 19:
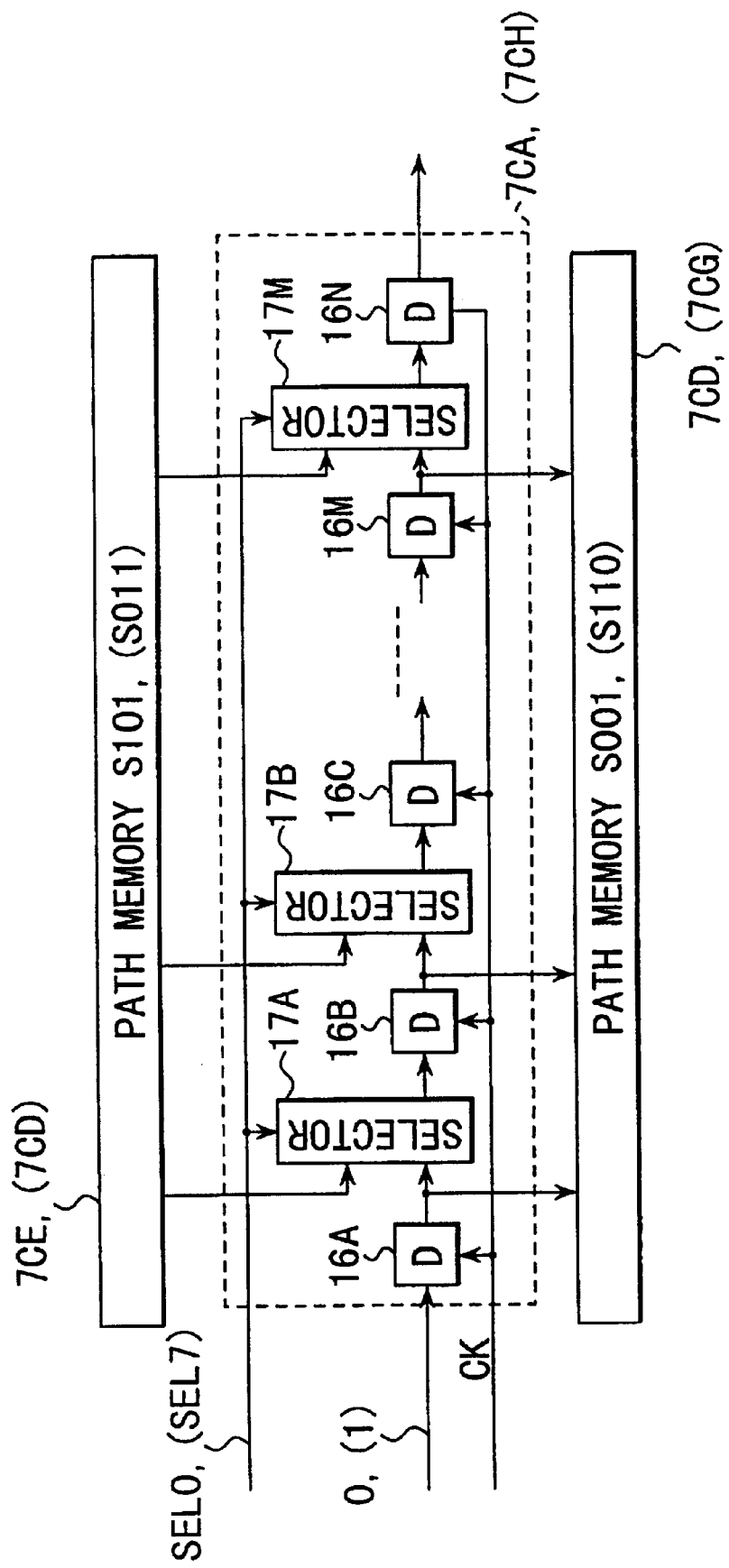
FIG. 19 is a block diagram showing a path memory unit in the Viterbi decoder of FIG. 18.
Figure 20:
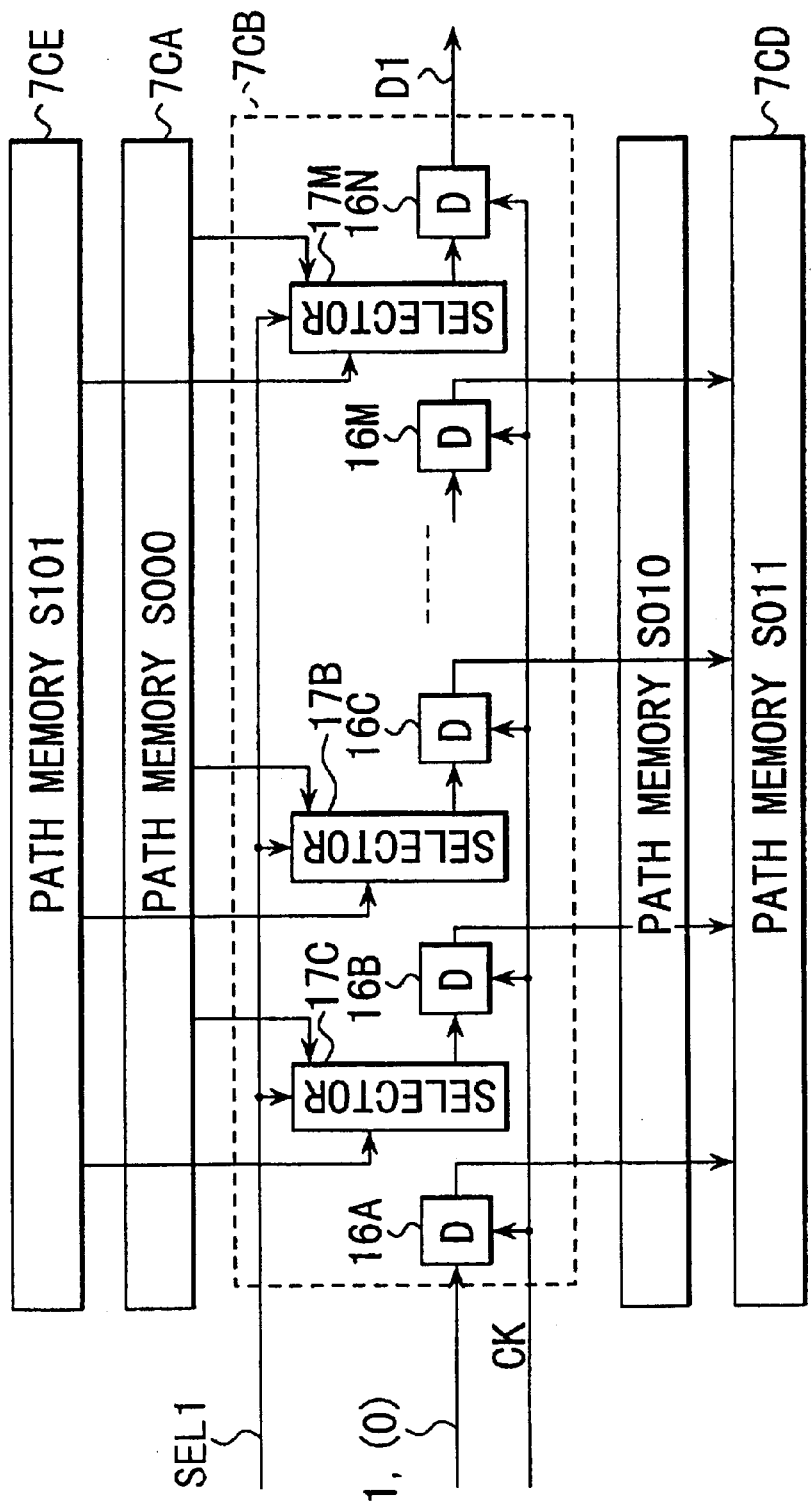
FIG. 20 is a block diagram showing the remainder of FIG. 19.

FIG. 1 is a block diagram showing a reproduction apparatus according to one embodiment of this invention. In this reproduction apparatus 21, identical features to those of a reproduction apparatus 1 described above in FIG. 16 are shown by corresponding symbols, and their description will not be repeated. In this reproduction apparatus 21, a digital reproduction signal DRF is processed in a maximum likelihood decoder 23 by referring to a provisional identification result D3 in a provisional identifier 22 so as to obtain a binary identification output D1.

Specifically, in the reproduction apparatus 21, a reproduction signal RF is equalized and output so that a clock can be reproduced by a PLL circuit 4 after binarizing by a binarizing circuit 3, and so that a binarized signal S2 output by this binarizing circuit 3 can be latched by a clock CK output by the PLL circuit 4, and a provisional identification result D3 output effectively equal to the decoded output D1. Specifically, the reproduction equalizer 24 converts the reproduction signal RF to an equalized signal by for example PR (1, 1), and outputs it.

Figure 2:
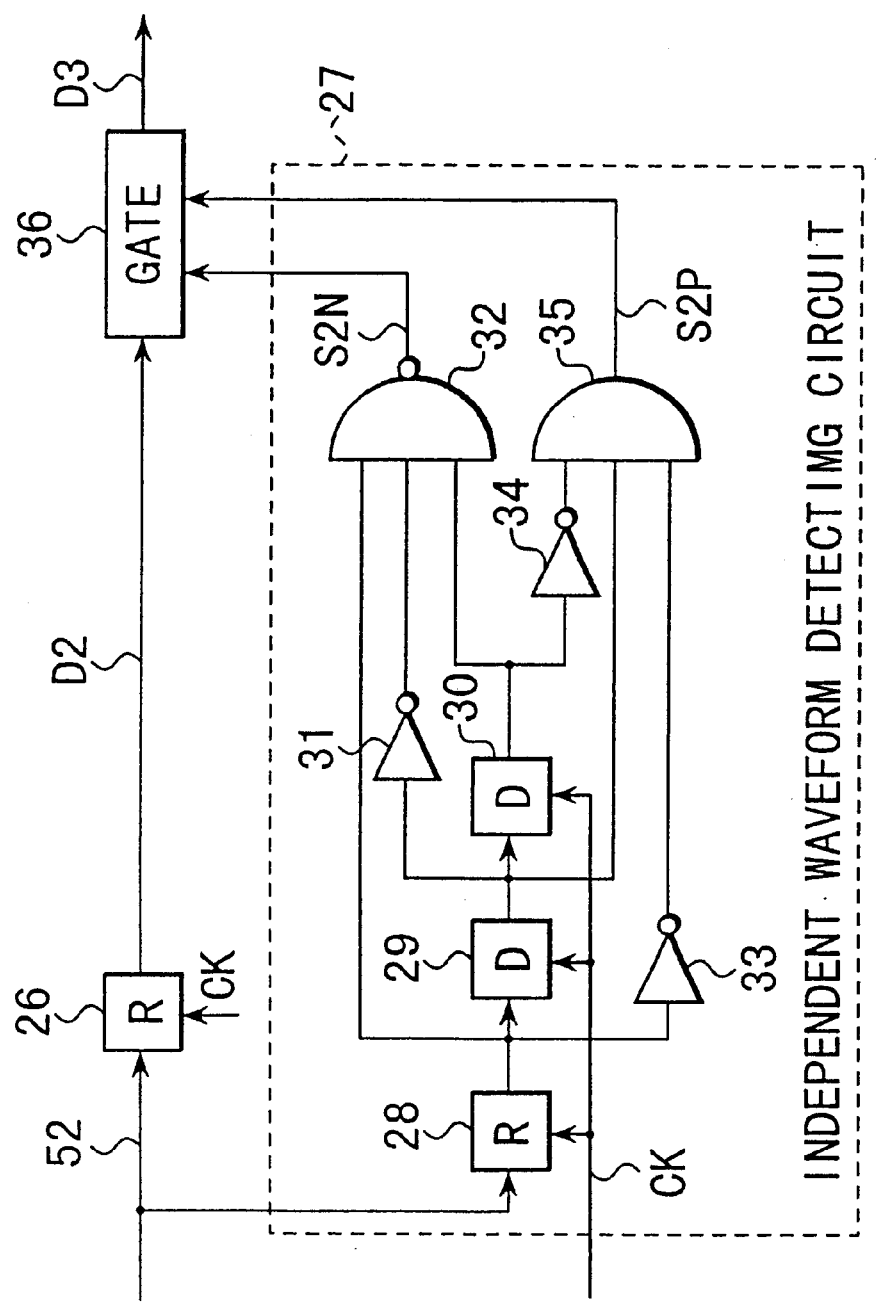
FIG. 2 is a block diagram showing a provisional identifier in the reproduction apparatus of FIG. 1.

As shown in FIG. 2, the provisional identifier 22 generates a provisional identification result D2 in a latch (R) 26 by sequentially latching the output signal S2 of the binarizing circuit 3 based on the clock CK.

Figure 3A:
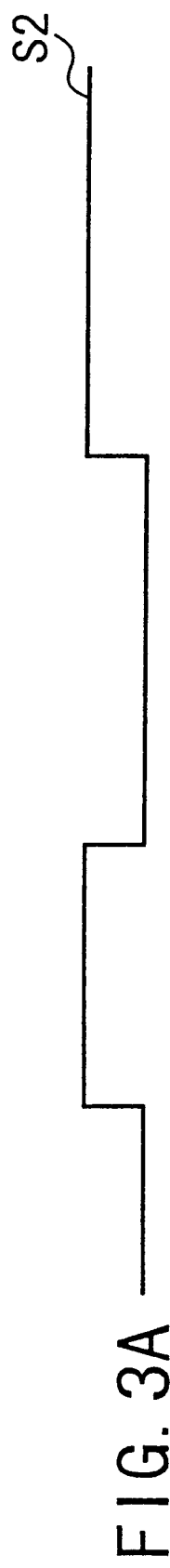
FIG. 3A–FIG. 3C are signal waveform diagrams used in describing the operation of the provisional identifier of FIG. 2.
Figure 3B:
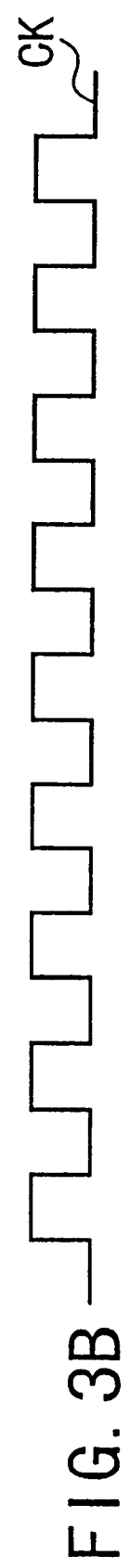
Figure 3C:
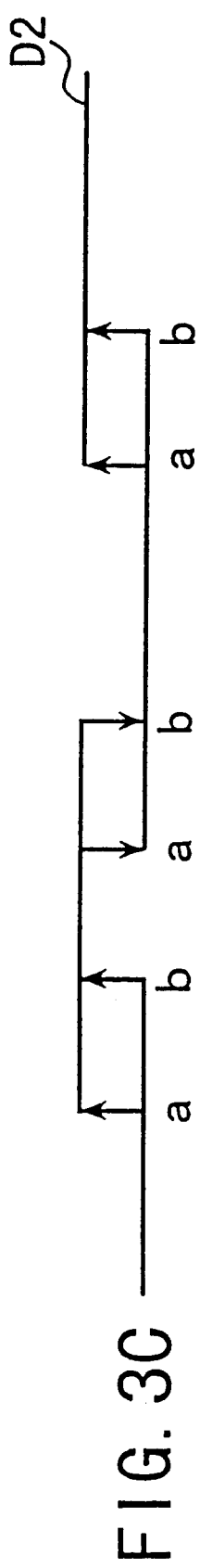

Herein, as shown in FIG. 3A–FIG. 3C, by latching the binarized signal S2 obtained by binarizing the PR (1, 1) equalization signal by the clock CK (FIG. 3A and FIG. 3B), an identification margin of $2^{1/2}$ times in the amplitude direction (i.e., amplitude tolerance) can be obtained compared to the case where the digital reproduction signal DRF is subjected to binary identification by an EPR4 equalization signal.

In the provisional identifier 22, when this binarized signal S2 is latched, the sequential binarized signal S2 is latched with a timing where the output signal of the reproduction equalizer 24, which is the basis for generating the clock CK, crosses the threshold value of the binarizing circuit 3 (in the case of this embodiment, a timing with which the edge of the clock CK appears as shown in FIG. 3).

Hence, in this identification result D2 (FIG. 3C), as the timing crosses a slice level, the timing of each edge has the same phase (hereafter referred to as front edge timing denoted by the symbol a) relative to the corresponding recording code during recording, or is delayed by one clock (hereafter referred to as rear edge timing denoted by the symbol b), and consequently in the provisional identification result D2, the identification contains an error.

Compared to the case where the digital reproduction signal DRF obtained by Nyquist equalization is simply subjected to binary identification, the identification is performed by twice the identification margin in the phase direction, so there is one clock identification error in each edge, however the recording code can be fairly correctly identified excepting for this one clock identification error.

If the binarized signal S2 is latched with a timing having a very small phase tolerance to generate the provisional identification result D2 in this way, as shown in FIG. 4A–FIG. 4D, if only one clock period of the signal level of the binarized signal S2 appears (FIG. 4A and FIG. 4B), there is a risk that it may be impossible to latch the appearance of this signal level due to jitter, etc., in the provisional identification result D2 (FIG. 4C).

Hence in the provisional identifier 22 (FIG. 2), in an independent waveform detecting circuit 27, the binarized signal S2 is sequentially latched with a fall-off edge timing of the clock CK by a latch (R) 28, the latch results are sequentially transferred by subsequent delay circuits (D) 29 and 30, and latch results for three successive clocks are thereby obtained with a timing which is ½ clock period different from the provisional identification result D2.

In the independent waveform detecting circuit 27, of the latch results for three successive clocks, the logic level of the latch result with the intermediate timing output by the delay circuit 29 is inverted by an inverter 31, and input together with the other latch results to an AND circuit 32. In this way, the independent waveform detecting circuit 27 generates a detected signal S2N with a negative independent waveform for which the logic level falls when the signal level of the binarized signal S2 falls for one clock on the negative side.

Likewise, in the independent waveform detecting circuit 27, of the latch results for three successive clocks, the logic levels of the latch results with the first and last timing output by the latch 28 and delay circuit 30 are inverted by inverters 33 and 34, and input together with the other latch results to an AND circuit 35. In this way, the independent waveform detecting circuit 27 generates a detected signal S2P with a positive independent waveform for which the logic level rises when the signal level of the binarized signal S2 rises for one clock on the positive side.

In the provisional identifier 22, whereas the provisional identification result D2 is generated by latching the binarized signal S2 based on the edge timing of the clock CK, the detected signal S2N with a negative independent waveform and the detected signal S2P with a positive independent waveform are superimposed by a gate circuit 36 (FIG. 4D), and the signal output by this gate circuit 36 is output as the provisional identification result D3.

The maximum likelihood decoder 23 (FIG. 1), by processing the digital reproduction signal DRF based on this provisional identification result D3, outputs the decoded output D1 which is the result of performing maximum likelihood determination on the reproduction signal RF.

As can be seen from the relation between the provisional identification result D3 (FIG. 5A) and state transitions (FIG. 5B) in FIG. 5A and FIG. 5B, the edge timing in the provisional identification result is either delayed by one clock relative to the recording code, or it is the correct timing, therefore this provisional identification result D does not precisely reflect state transitions.

However, it will be understood that if for example there is a merge to a state (S000) at a time k−1 when data transfer begins, there is a possibility that the digital reproduction signal DRF will split into two paths respectively at a time k and k+1, whereas if the provisional identification result D2 appears at a time k, the path leading to the state S000 cannot be obtained at the time k+1. In other words, if this provisional identification result D3 appears with a front edge timing, the digital reproduction signal DRF undergoes a transition to a state (S001) at the time k, and if the provisional identification result D2 appears with a rear edge timing, it undergoes a transition to the state (S001) at the following time k−1.

In FIG. 5A and FIG. 5B, changes due to bit inversion noise in the provisional identification result D3 are shown by arrows, and paths are shown by comparison with the provisional identification result D3 in the previous three clock intervals using symbols a and b corresponding to front edge and rear edge, and the symbol * which denotes that no particular bit inversion is specified. Therefore, the path b** from the time k−1 to the time k is the path corresponding to the case where the rear edge is correct in the provisional identification result D3 at the time k, the next path bb* is the path where the rear edge is correct in the bit inversion of the provisional identification result D3 at both of the times k and k+1, and similarly, the following paths up to a time k+2 are represented by the paths bb*.

Likewise, the path a** is a path corresponding to the case where the front edge is correct in the provisional identification result D3 at the time k, and the following paths aa* and ab* are paths respectively corresponding to the case where the front edge is correct in the bit inversion of the provisional identification result D3 at both of the times k and k+1, and the case where the front edge is correct at the time k while the rear edge is correct at the time k+1.

By describing the paths based on the bit inversion of the provisional identification result D3 in the previous three clock intervals in this way, in EPR4, paths which have a possibility of obtaining up to one merge can be determined based on the provisional identification result D3 of the immediately preceding three bits. Therefore to specify the state of the provisional identification result D3, as this provisional identification result D3 for one clock comprises one clock error, the paths leading up to one merge can be specified by the provisional identification result D3 for the immediately preceding three bits and immediately preceding bit.

In other words, regarding possible state transitions for a provisional identification result D3 of one bit, state transitions excepting those specified by the provisional identification result D3 from the immediately preceding three bits to the immediately preceding bit, cannot be obtained, so if state transitions except those estimated by the provisional identification result D3 from the immediately preceding three bits to the immediately preceding bit are excluded from the calculations, the construction of decoding circuit can be simplified by a corresponding amount.

In EPR4, as the intercode interference length is 4 bits, in the provisional identification result D3, a path split occurs when the logic level inverts once, and paths which split after four clocks merge. In the case of FIG. 5, if one path is excluded from the calculations due to the first bit inversion, and if bit inversions are not continuous in the provisional identification result D3 during this period (i.e., if a bit inversion occurs a maximum of three times in four clock intervals), paths wherein the symbols a and b are different corresponding to the first bit inversion, merge as in the case of the path denoted by the symbols bab relative to the path denoted by the symbols aab.

Therefore in this case, for the merged paths aab and bab, if a metric is specified and a corresponding provisional identification result is selected, a probable path can be selected from the paths aab, bab so as to obtain a corresponding identification result By calculating a metric based on the provisional identification result comprising an identification error of one clock interval, it is therefore seen that according to this embodiment, it is expedient to calculate a metric for a maximum of 4 states which is half the number of states that can obtained from the digital reproduction signal DRF in EPR4. Specifically, in the example shown in FIG. 5, at the time k+3 which is the fourth clock of the time k, the paths bbb, abb which split due to bit inversion at the time k, merge. It may be noted that, in the example of FIG. 5, paths do not merge in the states (S000) and (S001). This shows that although the paths bab, baa do merge in addition to the example shown in FIG. 5, these paths bab, baa are excluded by the provisional identification result due to the fact that there is a bit inversion in the provisional identification result D3 also at the time k+1.

Paths which split at this time k+1 merge also at the time k+4, which is the fourth clock from this time k+1. Therefore, if a path is selected from the sum of the branch metrics at this merge point, it can be determined whether the front edge is correct or the rear edge is correct for the bit inversion at the time k+1.

Hence, according to this embodiment, instead of the eight states (S000–S111), states can be estimated to calculate the corresponding metric from the provisional identification result D3 in three previous clock intervals in this provisional identification result D3, and a likelihood can be determined from this metric to specify the path. In other words, for the paths aaa to bbb considered possible from the provisional identification result D3 in three previous clock intervals, corresponding reference amplitude values are successively set, metrics are successively calculated based on this reference amplitude value, and at a merge point, a path is selected by determining a metric for two merging paths.

In the description of FIG. 5, the symbol * was used to show that the bit inversion in the corresponding provisional identification result D3 was not specified, but hereafter this symbol * will be replaced by a or b for the sake of convenience.

For the paths aaa to bbb, if branch metrics are successively summed to determine a likelihood, for a coding scheme where there is no limit d=1, bit inversions may occur successively in the provisional identification result D3 as shown by the times k+11 to k+14 in FIG. 5.

In this case, a path which splits at a time k+10 merges at the time k+14, but splits again, and as the intercede interference length is 4 bits, a path leading to the state (S001) is specified by the symbol aabb. However due to the provisional identification result D3, the path with this symbol aabb does not reach the state (S001) due to a path with the symbol babb, hence this path can be specified by the symbol abb by successively calculating metrics. In other words, in this case, at a time prior to the time k+14, corresponding reference amplitude values are set to predetermined values corresponding to each state and a metric having a large value is calculated so that impossible paths are excluded from the selection of metrics, and paths can be successively selected as described above.

The path leading to the state (S010) is specified by the symbol aaaa, and in this case also, as the path baaa does not reach the state (S010) due to the provisional identification result D3, this path can be specified by the symbol aaa by successively calculating metrics, and paths can likewise be successively selected as described above.

Further, the path reaching the state (S011) is specified by the symbol aaab, and in this case also, as the path baab does not reach the state (S010) due to the provisional identification result D3, this path can be specified by the symbol aab by successively calculating metrics, and paths can likewise be successively selected as described above.

On the other hand for the state (S101), the path with the symbol bbbb merges with the path with the symbol abbb, and of the paths with the symbols bbbb and abbb, the paths abb, bbb undergo a transition to the state (S101) due to the provisional identification result D3. Hence, by processing and selecting metrics due to these paths abb, bbb as described above, they can be described as paths with the symbol bb*.

However, regarding the paths aaa to bbb which are possible due to the provisional identification result D3 in the previous three clock intervals, if corresponding reference amplitude values are successively set to successively calculate metrics, the path abb leading to the symbol abob which merges in this state (S101), may be described in the same way as the path abb corresponding to the aforesaid symbol aabb for the state (S001).

In other words, regarding the paths aaa to bbb which are possible due to the provisional identification result D3 in the previous three clock intervals, when metrics are successively calculated, there is no limit d=1, and the intercode interference length is 4, and there are successive bit inversions in the provisional identification result D3, it is difficult to distinguish between paths successively corresponding to front edge, front edge, rear edge and rear edge which lead to different states. Therefore, according to this embodiment and in this case alone, another reference amplitude value is set. Another branch metric is also calculated from this reference amplitude value, and in one metric processing circuit, processing of the path abb corresponding to the symbol aabb is awaited so that the path metric is updated by this other branch metric.

Figure 6:
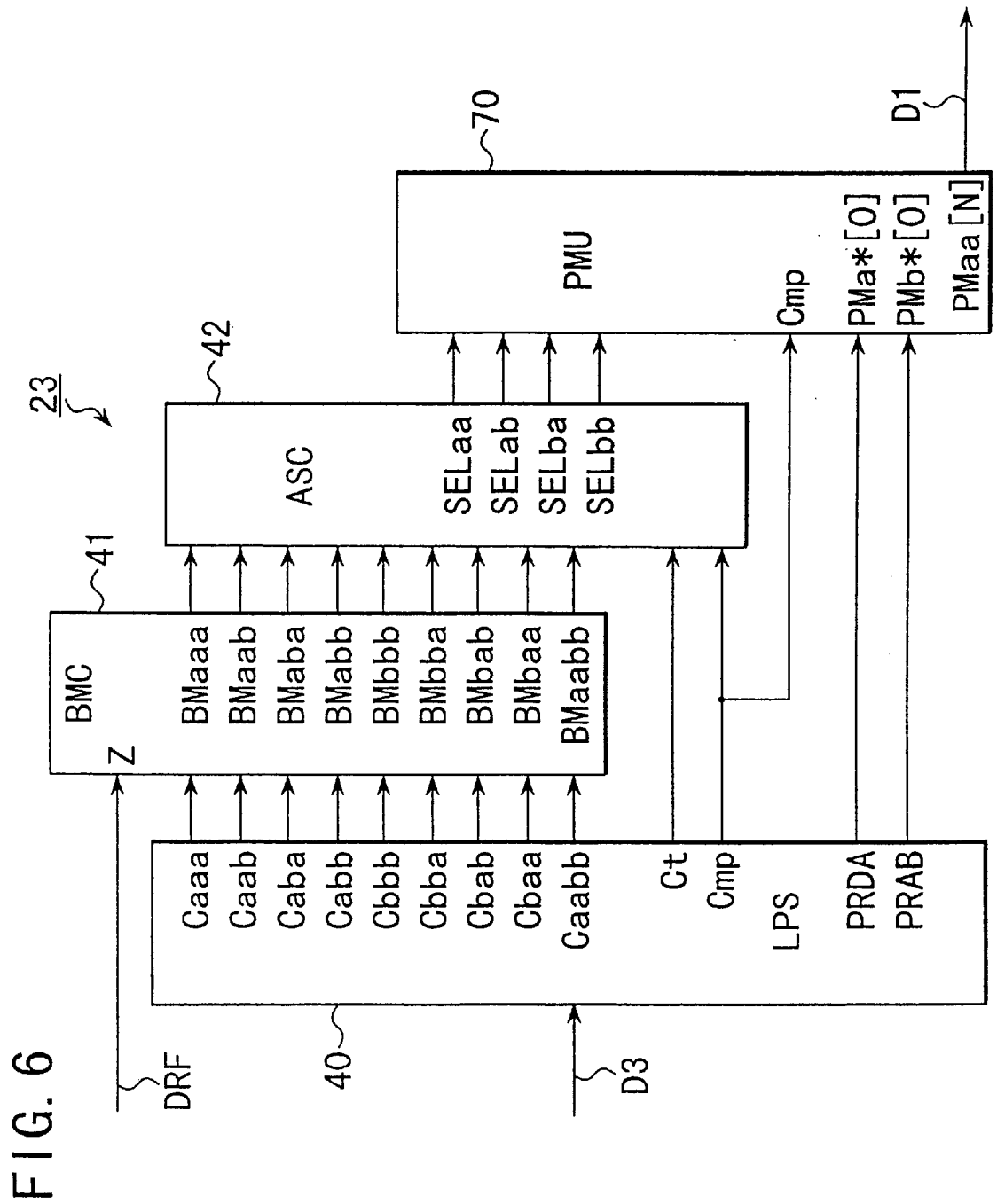
FIG. 6 is a block diagram showing a maximum likelihood decoder in the reproduction apparatus of FIG. 1.

FIG. 6 is a block diagram shown the details of the maximum likelihood decoder 23. In this maximum likelihood decoder 23, an LPS (Limited Path Selector) 40 comprises four delay circuits which sequentially delay the successive provisional identification results D3 and simultaneously output, in parallel, the provisional identification results D3 for four successive clocks which is the intercode interference length, and a memory which assigns addresses to the provisional identification results D4 for four successive clocks and outputs corresponding output data. Of these provisional identification results D3 for four successive clocks, the reference amplitude values Caaa to Cbbb for one route which corresponds to the three clocks nearest the present time, and the reference amplitude value Caabb corresponding to the four clocks, are output.

The reference amplitude values Caaa to Cbbb in one route are reference amplitude values for states specified by the paths aaa to bbb. Here, the reference amplitude values Caaa to Cbbb are shown by letters using the symbols a and b for convenience, but they are not necessarily reference amplitude values corresponding to three inversions in the provisional identification result D3. Herein, as they are reference amplitude values output by assigning addresses to the provisional identification results D3 for four successive clocks, if a bit inversion does not occur in the provisional identification result D3, they are set in FIG. 6 to reference amplitude values corresponding to states to which there are transitions by the above symbol *. The reference amplitude value Caabb is a reference amplitude value for a state specified by the path aabb.

When the reference amplitude values are output in this way, for reference amplitude values corresponding to states to which a transition is not possible due to the provisional identification result D3, the LPS 40 outputs a predetermined value so that a large value is obtained in the calculation of the next branch metric.

If the provisional identification result D3 undergoes a bit inversion, the LPS 40 outputs a path selection signal Cmp in which the logic level appears with a timing delayed by the intercede interference length from the timing of this bit inversion. To be specific, this path selection signal Cmp shows the timing with which paths, which split at the timing of this bit inversion, merge, and it commands selection of a metric.

The LPS 40 outputs a successive bit inversion identifying signal Ct in which the logic level appears when four bit inversions occur in succession. The LPS 40 also delays the provisional identification result D3 by a predetermined interval, generates reference signals PRDA and PRDB respectively for the timing corresponding to the case when the front edge is correct and the timing corresponding to the case when the rear edge is correct, and outputs these reference signals PRDA, PRDB as an initial setting signal.

A BMC (Branch Metric Calculator) 41 calculates the branch metrics BMaaa to bmbbb, BMaabb by performing the computations of the following equations between the reference amplitude values Caaa to Cbbb, Caabb, and the digital reproduction signal DRF.

$$BMaaa=(Z-Caaa)^2 BMaab=(Z-Caab)^2 BMaba=(Z-Caba)^2 BMabb=(Z-Cabb)^2 BMbbb=(Z-bb)^2 BMbba=(Z-Cbba)^2 BMbab=(Z-Cbab)^2 BMbaa=(Z-Cbaa)^2 BMaabb=(Z-Caabb)^2 \quad (3)$$

An ACS (Add-Compare-Select) 42 sums the branch metrics BMaaa to bmbbb, BMaabb to calculate a path metric, and outputs path selection signals SELaa to SELbb from this metric.

Figure 7:
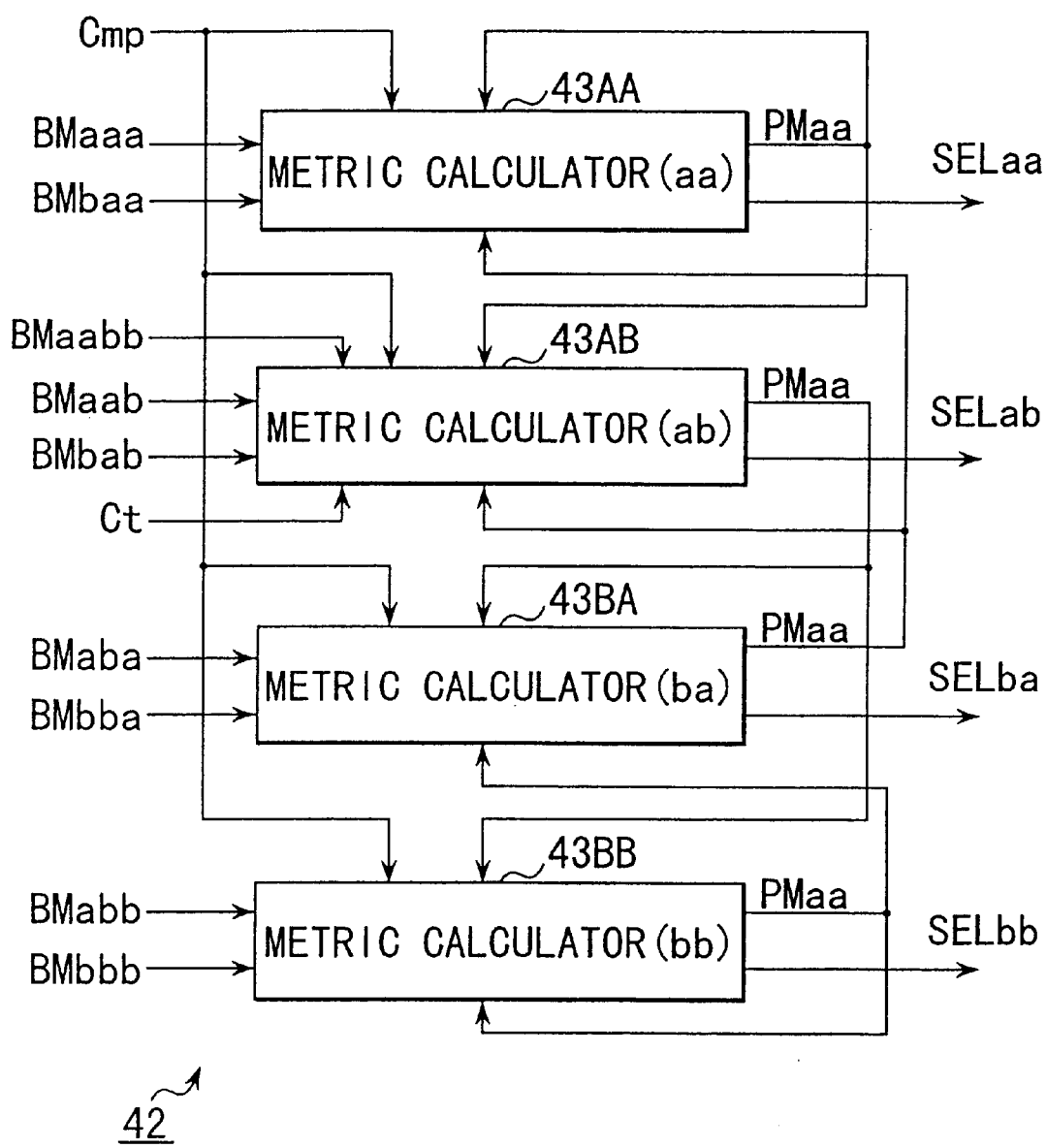
FIG. 7 is a block diagram showing a branch metric calculator in the maximum likelihood decoder of FIG. 6.

FIG. 7 is a block diagram showing the ACS 42. The ACS 42 comprises four different metric calculators 43AA to 43BB respectively corresponding to two merged paths. These metric calculators 43AA to 43BB comprise the metric calculator 43AA which assumes the front edge timing is correct in both of the two preceding bit inversions in the provisional identification result D3, the metric calculator 43AB which assumes the front edge and rear edge timings are correct in these two bit inversions, the metric calculator 43BA which assumes the rear edge and front edge timings are correct, and the metric calculator 43BB which assumes both the rear edge timings are correct.

Figure 8:
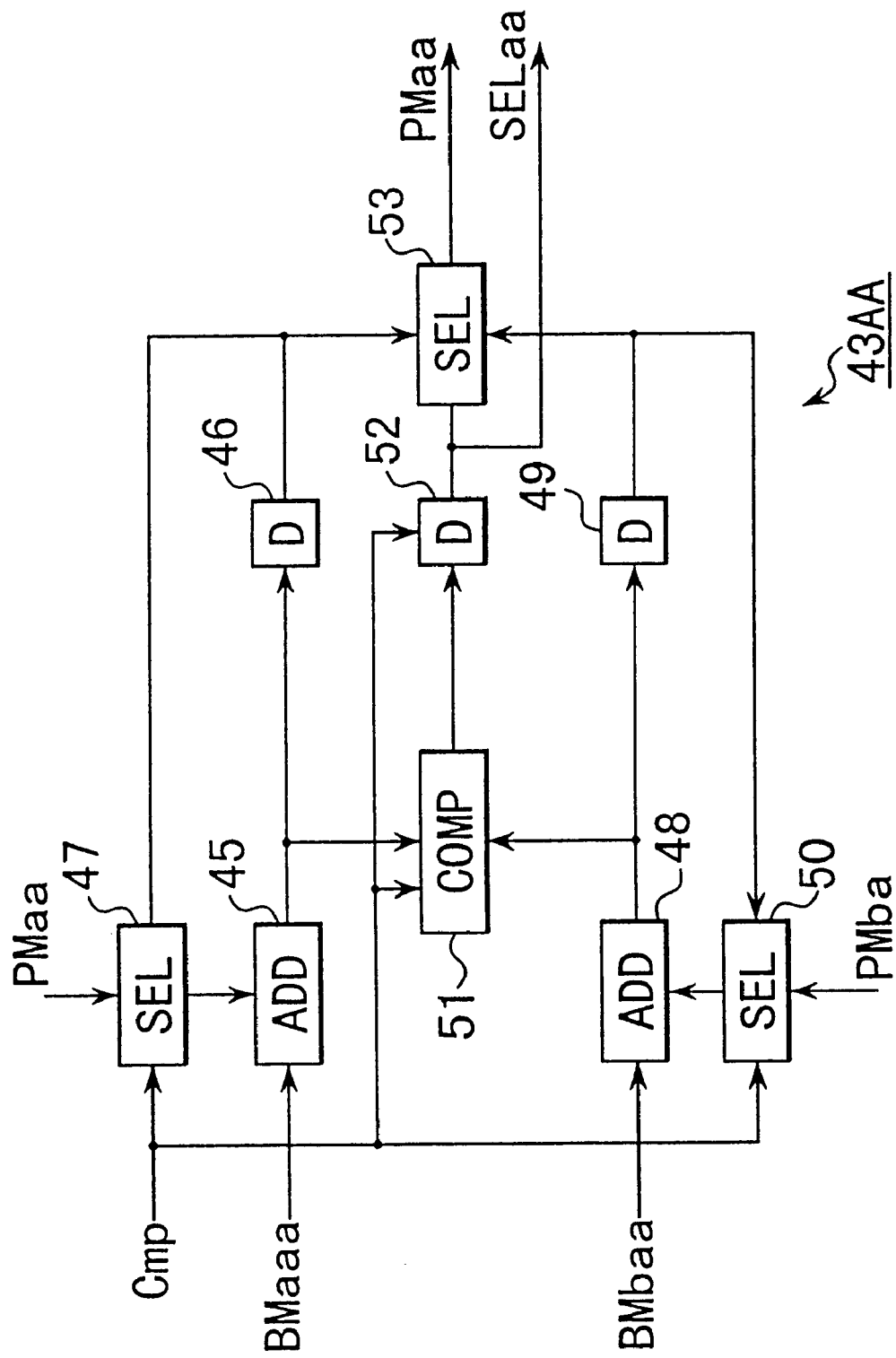
FIG. 8 is a block diagram showing a metric calculator in the branch metric calculator of FIG. 7.

As shown in FIG. 8, the first metric calculator 43AA sums the branch metric Bmaaa by an adder circuit (ADD) 45 and delay circuit (D) 46. When the path selection signal Cmp appears in merge, the metric calculator 43AA outputs a path metric PMaa selected by this first metric calculator 43AA to the adder circuit 45 by a selector (SEL) 47 interposed in this summation recycle loop, and sums the branch metric BMaaa based on the path metric PMaa selected by this metric calculator 43AA due to merge.

The metric calculator 43AA also sums the branch metric BMbaa with the adder circuit (ADD) 48 and delay circuit (D) 49, and when the path selection signal Cmp appears, a path metric PMba selected by a third metric calculator 43BA is output to an adder circuit 48 by a selector (SEL) 50 interposed in this summation recycle loop. In this way, the metric calculator 43AA sums the branch metric BMbaa based on a path metric PMab selected by this metric calculator 43AB due to merge.

When the path selection signal Cmp appears, a comparator circuit (COMP) 51 compares the output values of the adder circuits 45, 48 and outputs a comparison result, and a delay circuit 52 delays this comparison result by a timing due to delay circuits 46, 49 and outputs the result as a path selection signal SELaa. A selector 53 selects an output value of the delay circuits 46, 49 according to this selection signal SELaa. In this way, the metric calculator 43AA sums the branch metrics to generate two path metrics (a two-way path metric? *9), selects a path with a merge timing based on this path metric, and outputs this selection result.

The third and fourth metric calculators 43BA, 43BB have an identical construction to the first metric calculator 43AA apart from input to selectors 47, 48, and input to adder circuits 45, 48 respectively according to corresponding paths. Thus likewise, in these third and fourth metric calculators 43BA, 43BB also, branch metrics are respectively summed to generate two path metrics, a path is selected with merge timing based on this path metric, and this selection result is output.

Figure 9:
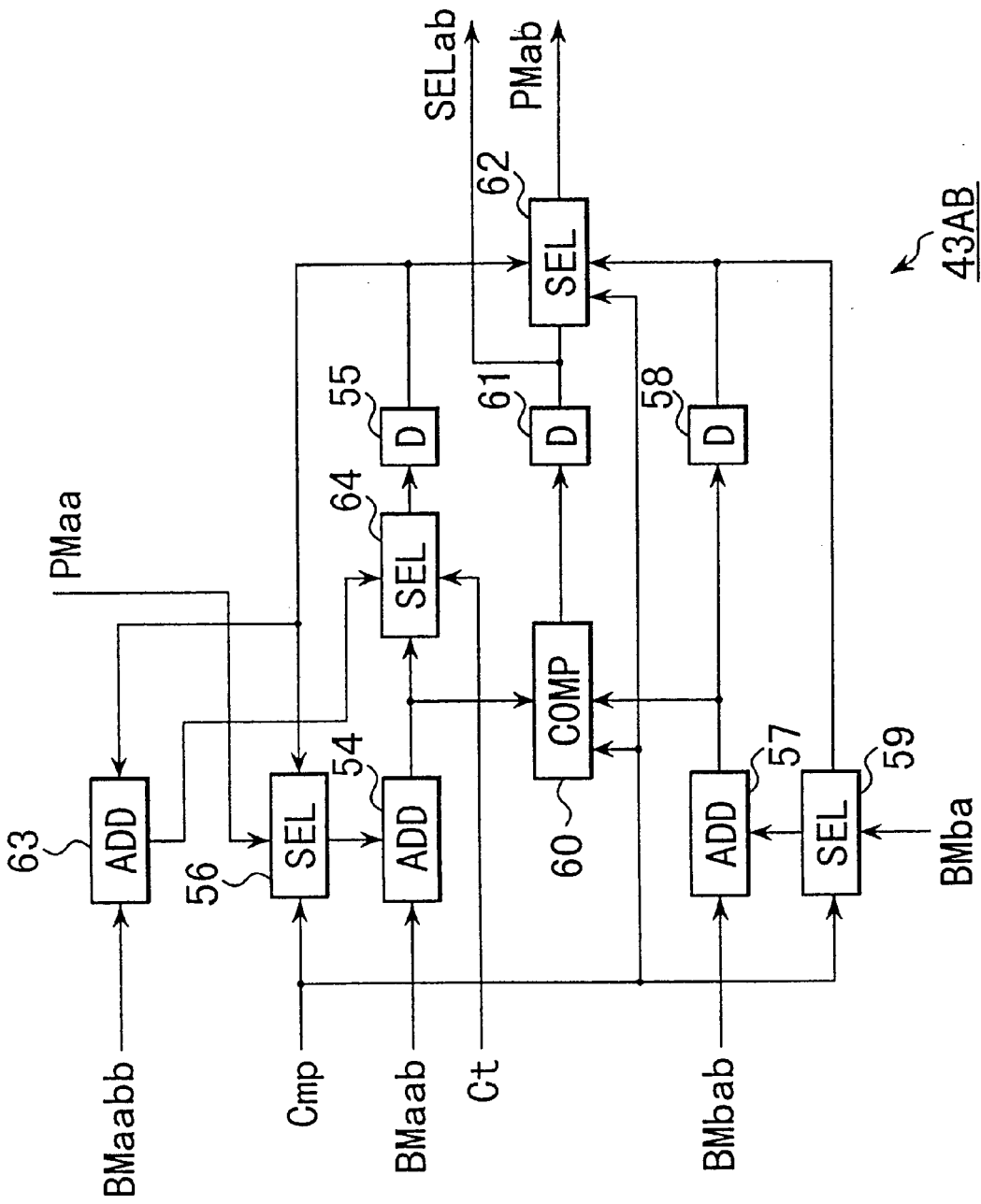
FIG. 9 is a block diagram showing another metric calculator in the branch metric calculator of FIG. 7.

FIG. 9 is a block diagram showing the second metric calculator 43AB. In this metric calculator 43AB, as in the case of the other metric calculator 43AB, the branch metric Bmaab is added by an adder circuit (ADD) 54 and delay circuit (D) 55, and when the path selection signal Cmp appears, the path metric PMaa selected in the first metric calculator 43AA by a selector (SEL) 56 interposed in this summation recycle loop is output to the adder circuit 54. In this way, the branch metric calculator 43AB adds the branch metric BMaab based on the path metric PMaa selected by the metric calculator 43AA due to merge.

Also in this metric calculator 43AB, the branch metric BMbab is added by an adder circuit (ADD) 57 and delay circuit (D) 58, and when the path selection signal Cmp appears, the path metric PMba selected in the third metric calculator 43BA by a selector (SEL) 59 interposed in this summation recycle loop is output to the adder circuit 57. In this way, the branch metric calculator 43AB adds the branch metric BMab based on the path metric PMba selected by the metric calculator 43BA due to merge.

When the path selection signal Cmp appears, the comparator circuit (COMP) 60 compares the output values of the adder circuits 54, 57 and outputs the comparison result, and a delay circuit 61 delays this comparison result by a timing due to delay circuits 55, 58 and outputs the result as a path selection signal SELab. Corresponding to the appearance of the path selection signal Cmp, a selector 62 selects the output values of the delay circuits 55, 61 according to this selection signal SELab. In this way, the metric calculator 43AB sums the branch metrics to generate two path metrics, selects a path with a merge timing based on this path metric, and outputs this selection result.

Further, the metric calculator 43AB adds the branch metric BMaabb and path metric PMaa in the adder circuit (ADD) 63, and when the identifying signal Ct with successive bit inversions appears, the output value of this adder circuit 63 is set in a summation loop by changing over the contact of a selector (SEL) 64 interposed between the adder circuit 54 and delay circuit 55. Therefore when bit inversion has occurred four times in succession in one clock period, as in the case of the other metric calculators, the metric calculator 43AB processes the path metric corresponding to one reference amplitude value Caaa to Cbbb, outputs the selection signal SELab and path metric PMab, and updates the path metric by the branch metric BMaabb and path metric PMaa corresponding to the remaining reference amplitude value Caabb.

A PMU (Path Memory Unit) 70 receives the reference signals PRDA, PRDB due to the provisional identification result D3 based on the selection signals SELaa to SELbb output by the ACS 42, and thereby outputs the decoded output D1.

Figure 10:
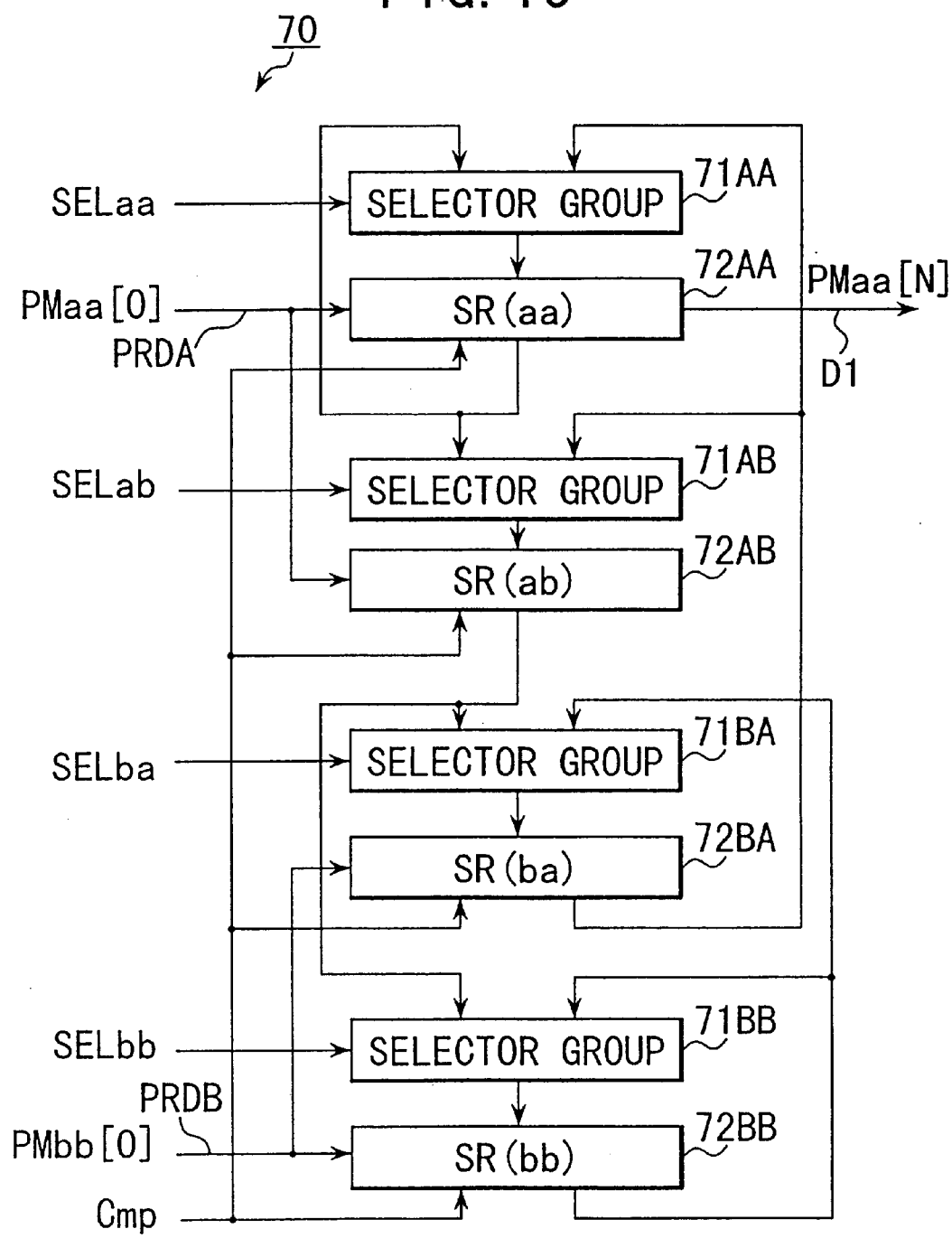
FIG. 10 is a block diagram showing a path memory unit in the maximum likelihood decoder of FIG. 6.

Specifically, as shown in FIG. 10, the path memory unit 70 comprises selector groups 71AA to 71BB corresponding to each path, and shift register groups (SR(aa) to SR (bb)) 72AA to 72BB corresponding to the selector groups 71AA to 71BB, and respectively receives corresponding histories to generate the decoded output D1.

Figure 11:
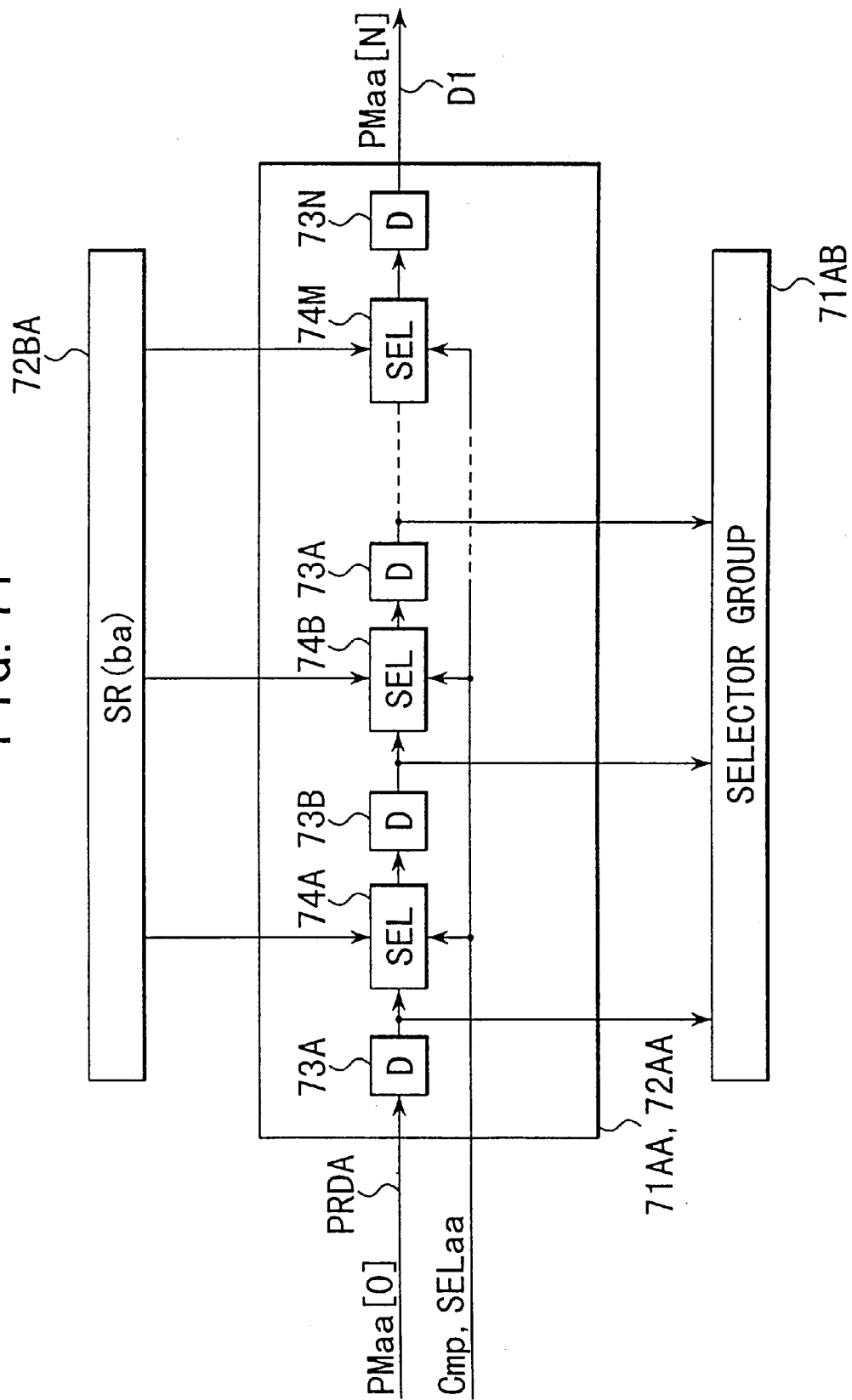
FIG. 11 is a block diagram showing a path memory in the path memory unit of FIG. 10.

FIG. 11 is a block diagram showing the first selector group 71AA and shift register group 72AA. The shift register group 72AA comprises a predetermined number of latches (number of latches equal to or greater than the number of paths which merge, generally a number equivalent to 16 to 32 bits) (D) 73A–73N arranged in series. The selector group 71AA comprises selectors (SEL) 74A to 74M which selectively output the history of the immediately preceding latch or the history latched by the latch corresponding to the third shift register group 72BA to the next latch, and which are disposed between these latches 73A to 73N,.

When the path selection signal Cmp appears, these selectors (SEL) 74A to 74M output the history due to the third shift register group 72BA or the history latched by the immediately preceding latch to the next latch according to the selection signal SELaa, and when the path selection signal Cmp falls, they output the history latched by the immediately preceding latch to the next latch.

Of the reference signals PRDA, PRDB output by the LPS 40, the first latch 73A inputs the reference signal PRDA corresponding to the case where the front edge is correct as an initialization value, whereas the last latch 73N outputs the decoded output D1.

In an identical construction, the second selector group 7BA and shift register group 72AB comprise selectors 74A to 74M which selectively output the history due to the first shift register group 72AA and the history due to the third shift register group 72BA to the next latch. When the path selection signal Cmp appears, the history of these shift register groups 72AA or 72BA is output to the next latch according to the selection signal SELaa, and when the path selection signal Cmp falls, the history is simply shifted. The decoded result D1 is thereby generated in the same way.

In an identical construction, the third selector group 71BA and shift register group 72BA comprise the selectors 74A to 74M which selectively output the history due to the second shift register group 72AB and the history due to the first shift register group 72BB to the next latch. When the path selection signal Cmp appears, the history of these shift register groups 72AB or 72BB is output to the next latch according to the selection signal SELba, and when the path selection signal Cmp falls, the history is simply shifted. The decoded result D1 is thereby generated in the same way.

In an identical construction, the fourth selector group 71BB and shift register group 72BB comprise the selectors 74A to 74M which selectively output the history due to the second shift register group 72AB and its own history to the next latch. When the path selection signal Cmp appears, these histories are output to the next latch according to the selection signal SELbb, and when the path selection signal Cmp falls, the history is simply shifted. The decoded result D1 is thereby generated in the same way.

(1-2) Action of first embodiment

In the aforesaid construction, in the reproduction apparatus 21 (FIG. 1), the reproduction signal RF reproduced from a recording medium such as a hard disk, for example, is equalized by the reproduction equalizer 24 so that it can be identified or locked by binarization, and binarized by the binarizing circuit 3. The binary signal S2 obtained as a result is input to the PLL circuit 4, and the clock CK is reproduced therein.

The binary signal S2 is sequentially latched based on the edge on the generation reference side of the clock CK in the provisional identifier 22 (FIGS. 2 and 3), and the reproduction signal RF which is the input signal is thereby identified by effectively one clock identification error to generate the provisional identification result D2 in the reproduction apparatus 21.

In this way, in the reproduction apparatus 21, the reproduction signal RF can be provisionally identified with sufficient amplitude tolerance and phase tolerance, and the final identification result D1 can be detected with simplicity and certainty.

Further, in the independent waveform detecting circuit 27 of this provisional identifier 22, the binary signal S2 is sequentially latched with a timing offset by ½ clock period relative to the timing used for generating the provisional identification result D2, the logic levels of three successive clock latch results are determined by the AND circuits 32, 35, the timing with which the logic level inverts during one clock interval is thereby detected from the reproduction signal RF, and the provisional identification result D3 obtained by correcting the previous provisional identification result D2 is output from the gate circuit (FIG. 4).

Hence, in the reproduction apparatus 21, when the provisional identification result D3 is generated by identifying the reproduction signal RF by one clock identification error, the reproduction signal RF can be correctly provisionally identified even when the phase of the reproduction signal RF has largely changed due to jitter, etc.

At the same time, the reproduction signal RF is equalized by the reproduction equalizer 24, and analog/digital converted to a digital reproduced signal by the analog/digital conversion circuit 5. This digital reproduced signal is then Nyquist equalized by the reproduction equalizer 25 and the reproduced signal DRF, which is the equalized signal from EPF4, is thereby generated.

In the maximum likelihood decoder 23, the number of state transitions which can be obtained from this digital reproduction signal DRF is limited based on the provisional identification result D3, and the most probable state transition of these limited transitions is detected to generate the identification result D1.

Specifically, in the maximum likelihood decoder 23 (FIG. 6), the provisional identification result D3 is input to the LPS 40, the reference amplitude values Caaa to Cbbb, Caabb corresponding to paths according to the identification results of four successive clocks are sequentially generated, and the branch metrics BMaaa to BMbbb, BMaabb which are the distances of the digital reproduction signal DRF relative to the reference amplitude values Caaa to Cbbb, Caabb are calculated by the subsequent branch metric calculator 41.

In the following branch metric calculator 42 (FIG. 7), the branch metrics BMaaa to BMbbb, BMaabb are input to the branch metric calculators 43AA to 43BB for each merge path, the branch metrics are summed to calculate path metrics by summing with the adder circuit 45 and delay circuit 46 or the adder circuit 48 and delay circuit 49 in the metric calculators 43AA to 43BB (FIG. 8), and a path metric is compared by the comparator 51 at a timing at which the paths merge after four clocks have elapsed from bit inversion in the identification result D3.

Hence, in the maximum likelihood decoding circuit 23, it is determined which of the merged paths is probable, the determination result is output to the subsequent path memory unit 70 as the selection signals SELaa to SELbb, and this selected path metric is set as a branch metric summation reference by the selectors 47, 50.

At this time, in the maximum likelihood decoder 23, the reference amplitude values Caaa to Cbbb for one route are generated according to the logic level of three successive clocks of this provisional identification result D3, the distance of the digital reproduction signal DRF from these reference amplitude values Caaa to Cbbb for one route is detected to calculate the branch metric, and the path metric is calculated. In this way, the maximum likelihood decoder 23 eliminates state transitions which cannot be obtained, and limits the state transitions which can be obtained from these digital reproduction signals DRF. In all, the path metric is calculated by metric calculators for four routes to determine the maximum likelihood, and processing is performed by four routes also for the following path memory. Therefore, maximum likelihood decoding can be performed on the digital reproduction signal DRF by a simple construction.

Of these reference amplitude values Caaa to Cbbb for one route, the branch metric is set to a large value for paths for which transitions are impossible, hence even if three bit inversions occur from when a path branches due to one bit inversion to when it merges after four clocks, maximum likelihood decoding can be correctly performed on the digital reproduction signal based on the provisional identification result D3.

Further, when there are successive bit inversions due to the logic level of four successive clocks of the provisional identification result D3, the reference amplitude value Caabb for a path where the front edge, front edge rear edge, rear edge are assumed to be correct is generated separately (FIGS. 6 and 9) and the branch metric BMaabb is calculated for this reference amplitude value Caabb, by awaiting the determination of the corresponding path and updating the corresponding path metric by this branch metric BMaabb, maximum likelihood decoding can be correctly performed even in the case of a coding scheme where the digital reproduction signal DRF allows successive bit inversions.

Consequently, in the maximum likelihood decoder 23, due to the selection signals SELaa to SELbb detected in this way, histories are sequentially received due to the corresponding provisional identification results PRDA, PRDB in the following path memory unit 70 (FIGS. 10, 11), and the decoded result D1 is generated.

(1-3) Advantages of the first embodiment

In the above construction, the reproduction signal RF is provisionally identified by one clock identification error, the timing with which the logic level inverts during one clock interval is detected by the reproduction signal RF to correct the provisional identification result D2, and the state transitions which can be obtained from the digital reproduction signal DRF are limited based on this provisional identification result D3. Hence, even in a coding scheme where a bit inversion occurs during one clock interval, maximum likelihood decoding can be performed by a simple construction.

Specifically, by limiting the state transitions which can be obtained from the digital reproduction signal DRF to state transitions of the digital reproduction signal DRF corresponding to a logic level inversion in the provisional identification result D3, and to state transitions of the digital reproduction signal DRF at a timing wherein the logic level inversion in the provisional identification result D3 is delayed by one clock period, the construction of the metric calculator can be reduced to effectively ½ compared to the prior art.

Further, the distances BMaaa to BMbbb from the reference amplitude values Caaa to Cbbb corresponding to n−1 (3) bit inversions of the provisional identification result D3 relative to the intercede interference length n (4) of the digital reproduction signal DRF are summed, the probabilities BMaa to BMbb of one route are calculated, the selection signals SELaa to SELbb, which are the determination results of the probabilities, are output, and the probability Mab corresponding to the aforesaid probabilities Maa to BMbb for one route is updated by the distance BMaabb from the reference amplitude value Caabb corresponding to a predetermined logic level when the front edge, front edge, rear edge, rear edge are correct for n successive bits of the provisional identification result D3, and therefore, the recording code in the decoding scheme where a bit inversion occurs during one clock interval can be decoded with certainty even when the structure of the metric calculator, etc., is reduced to effectively ½.

(2) Embodiment 2

In this second embodiment, the reproduction signal is subjected to a maximum likelihood determination by using FEPR4. In the second embodiment, the construction is identical to that of the aforesaid reproduction apparatus described in FIG. 1 excepting that the construction of the reproduction equalizers 24, 25 and maximum likelihood decoder are different, so their description will not be repeated here.

Figure 12:
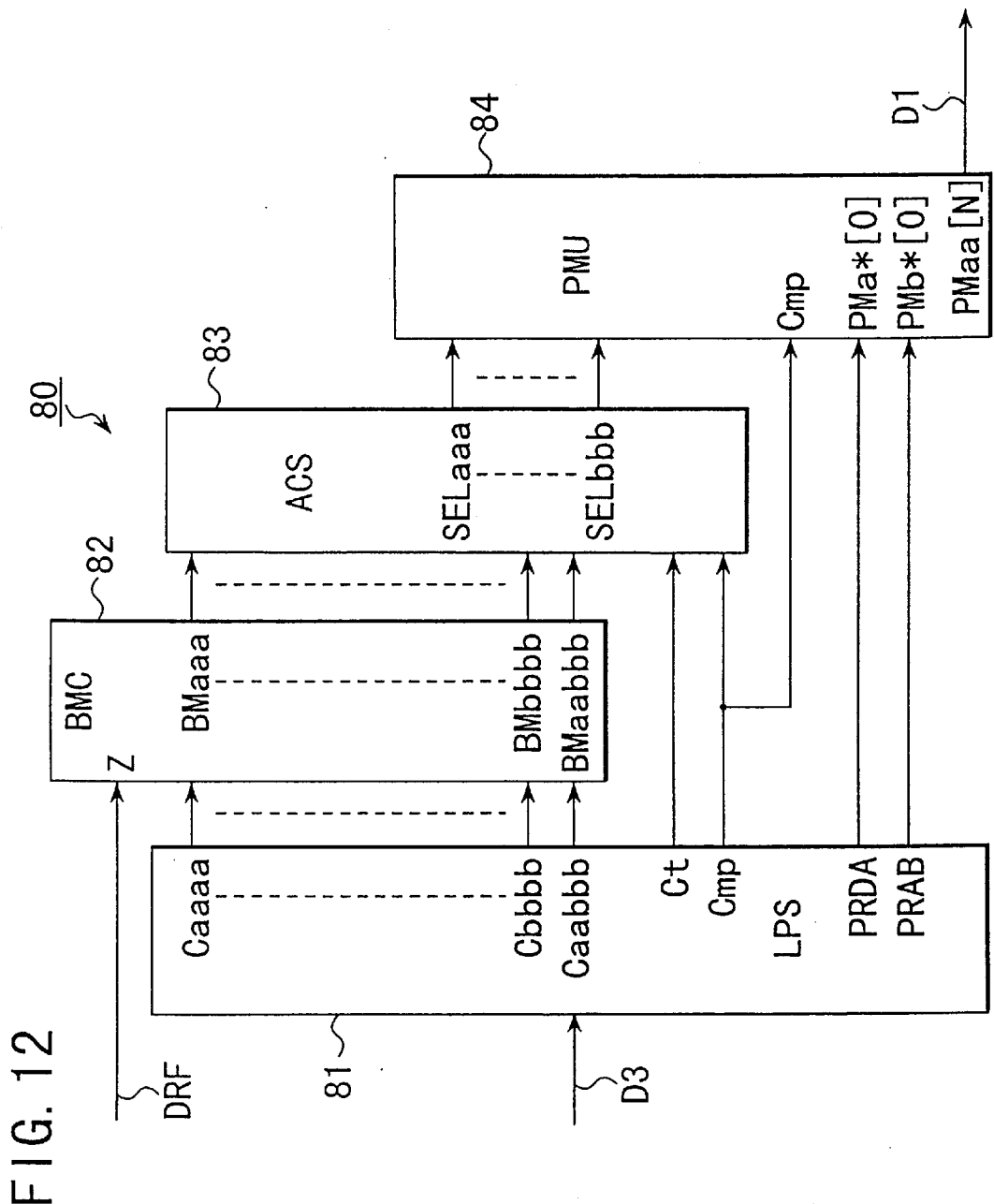
FIG. 12 is a block diagram showing a maximum likelihood decoder in a second embodiment.

FIG. 12 is a block diagram showing a maximum likelihood decoder 80 according to this embodiment. The digital reproduction signal DRF which is the equalized signal due to EEPR4 is input to this maximum likelihood decoder 80. As in the case of the maximum likelihood decoder 23 of the first embodiment, the maximum likelihood decoder 80 limits the state transitions which can be obtained from the digital reproduction signal DRF based on the provisional identification result D3, and detects the most probable state transition from these limited state transitions to output the identification result of the digital reproduction signal DRF. Hence, also in this embodiment, the digital reproduction signal DRF can be decoded, even for a coding scheme where a bit inversion for one clock is permitted, by a simple construction.

Herein, the digital reproduction signal DRF has an intercode interference length of 5, the path splits corresponding to a bit inversion of the provisional identification result D3 and merges at the fifth clock. Also, in the case of a coding scheme where d is not limited, the logic level inverts a maximum of five times during the interval of five clocks.

In this case, therefore, the digital reproduction signal DRF is processed in the same way to that of the maximum likelihood decoder 23 of the first embodiment, and the digital reproduction signal DRF is decoded by eight metric calculators and path memories.

Specifically, in the same way as the LPS 40 described in the first embodiment, the LPS 81 outputs reference amplitude values Caaaa to Cbbbb for one route corresponding to four successive bits of the provisional identification result D3, and a reference amplitude value Caabb corresponding to five successive bits of the provisional identification result D3. Caaaa to Cbbbb are reference amplitude values corresponding to the paths aaaa, baaa, aaab, baab, aaba, baba, abaa, bbaa, aabb, babb, abba, bbba, abab, bbab, abbb, bbbb. The reference amplitude value Caabb is the reference amplitude value for the case where the front edge, front edge, rear edge, rear edge are correct for a bit inversion in the provisional identification result D3.

The LPS 81 outputs reference signals PRDA, PRDB at a timing respectively corresponding to the cases when the front edges are correct and the rear edges are correct for the selection signal Cmp showing a path merge corresponding to a bit inversion in the provisional identification result D3, and the successive bit inversion identification signal Ct where a logic level appears when five bit inversions occur in succession.

A branch metric calculator 82 calculates and out puts branch metrics BMaaaa to BMbbbb, BMaabbb which are distances of the digital reproduction signal from these reference amplitude values Caaaa to Cbbbb, Caabbb. This calculation is performed by the following equations:

$$BMaaaa=(Z-Caaaa)^2 \; BMbaaa=(Z-Cbaaa)^2 BMaaab=(Z-Caaab)^2 BMbaab=(Z-Cbaab)^2 BMaaba=(Z-Caaba)^2 BMbaba=(Z-Cbaba)^2 BMabaa=(Z-Cabaa)^2 BMbbaa=(Z-Cbbaa)^2 \quad (4)$$

$$Bmaabb=(Z-Caabb)^2 BMbabb=(Z-Cbabb)^2 BMabba=(Z-Cabba)^2 BMbbba=(Z-Cbbba)^2 BMabab=(Z-Cabab)^2 BMbbab=(Z-Cbbab)^2 BMabbb=(Z-Cabbb)^2 BMabbb=(Z-Caabbb)^2 \quad (5)$$

A branch metric calculator 83 processes these branch metrics BMaaaa to Bmbbbb, BMaabbb to output the path selection signals SELaaa to SELbbb.

Figure 13:
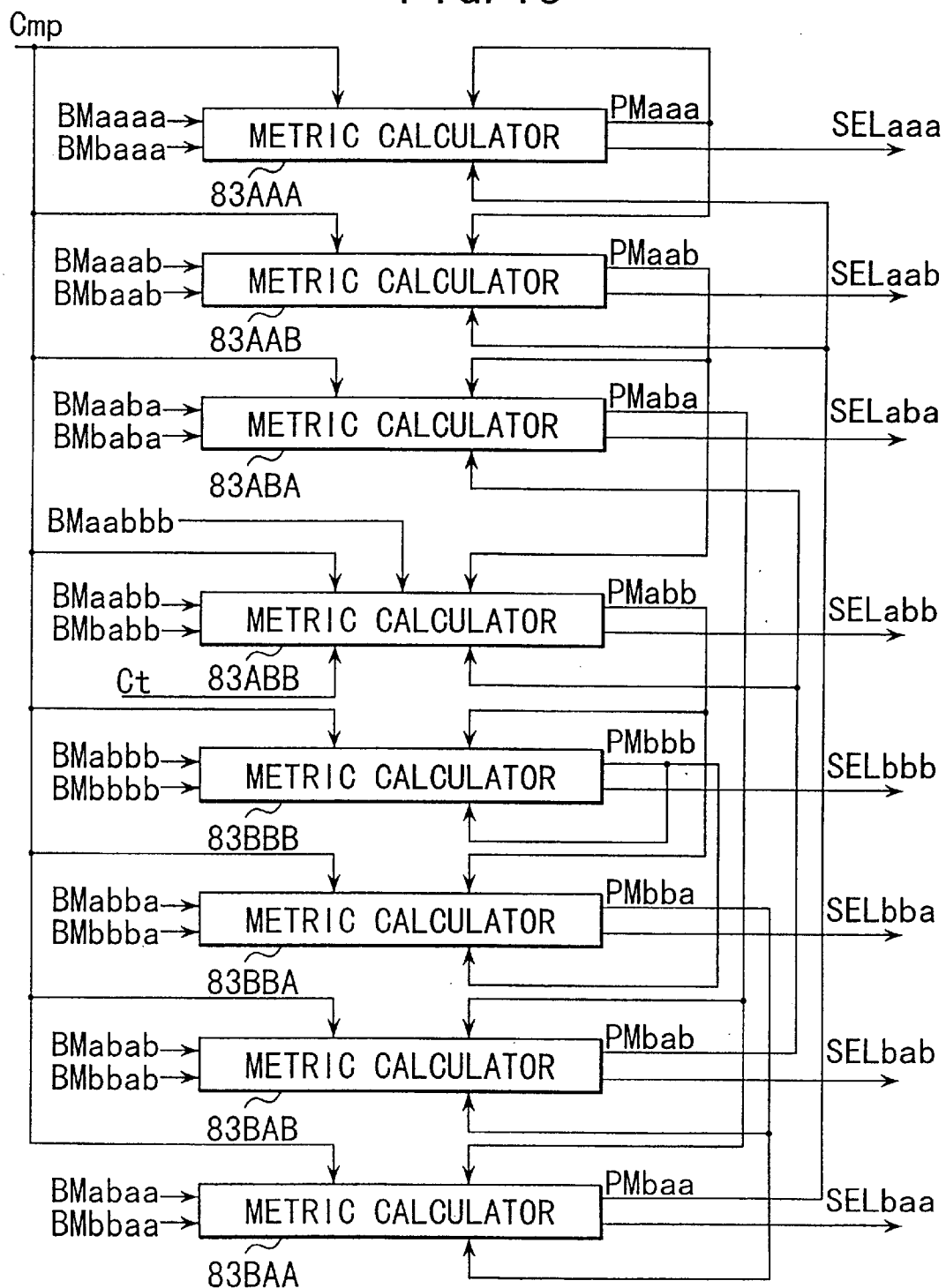
FIG. 13 is a block diagram showing a branch metric calculator in the maximum likelihood decoder of FIG. 12.
Figure 15:
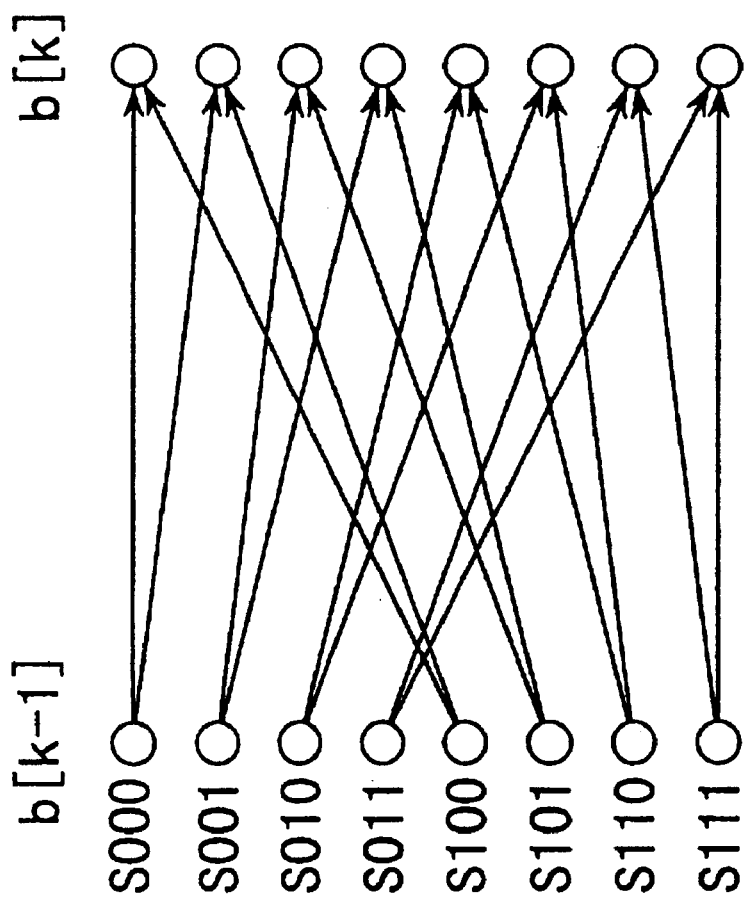
FIG. 15 is a state transition diagram for FIG. 14.

FIG. 13 is a block diagram showing this branch metric calculator 83. It comprises eight metric calculators 83AAA to 83BBB which calculate path metrics corresponding to the reference amplitude signals Caaa to Cbbb for one route and select paths. As in the aforesaid first embodiment, for the digital reproduction signal DRF with an intercede interference length of 5, in the case of a coding scheme where d has no limit, it may occur that bit inversions in one clock occur successively until split paths merge at the fifth clock.

Therefore in this case, during processing by the eight metric calculators 83AAA to 83BBB, for paths corresponding successively to the front edge, front edge, rear edge, rear edge in successive bit inversions in the provisional identification result D3, it may be difficult to distinguish between paths making transitions to different states.

Describing this by comparison with FIG. 5, the paths merge at a time k+15 instead of the time k+14, and the codes aabbb, aaaaa, aaaab, aaabb, bbbbb, abbbb are generated. The paths aaaaa and aaaab split from the path aaaa, paths are selected and path metrics are received in the first and second metric calculators 83AAA and 83AAB.

In the case of the paths bbbbb and abbbb, the parts are compared and selected in the eighth metric calculator 83BBB. On the other hand, in the case of the first path aabbb, as in the case of the first path aabb, processing of the corresponding branch metric for one route is awaited, the path metric is updated and path metric processing is thereby performed in the fourth metric calculator 83AABB.

Thus for an intercode interference length of 5, even in the case of a coding scheme where there is no limit to d, the maximum likelihood decoder 80 decodes the digital reproduction signal DRF by a simple construction.

A path memory unit 84 selectively receives provisional identification results PRDA, PRDB based on these selection signals SELaaa to SELbhb, and thereby outputs the decoded result D1.

According to the second embodiment, the same advantages as those of the first embodiment can be obtained even when the intercede interference length is 5.

(3) Other Embodiments

In the aforesaid embodiments, the case was described of calculating the branch metric by raising the difference from a reference amplitude value to a power of 2, but the invention is not limited to this, and may also be applied widely to cases where the absolute value of the difference from the reference amplitude value is taken as the branch metric.

According to the aforesaid embodiments, the case was described for an intercede interference length of 4 or 5, but the invention is not limited to this, and may also be applied widely to cases of other intercode interference lengths.

According to the aforesaid embodiments, the case was described of using EPR4 or EEPR4, but the invention is not limited to this, and may also be applied widely to other coding schemes.

According to the aforesaid embodiments, the case was described where the reproduction signal was successively equalized by reproduction equalizers, but the invention is not limited to this, and depending on the transmission properties of the sending path, for example, the equalizer for provisional identification and the equalizer for maximum likelihood decoding may be disposed in parallel.

Further, according to the aforesaid embodiments, the case was described where there was no limit to d, and independent waveforms were detected to correct the identification result, but the invention is not limited to this. For example, it may occur that a bit inversion equal to or less than the minimum inversion width is detected in the provisional identification result, but maximum likelihood decoding can still be performed even if states to which transitions are made are limited by the provisional identification result by correcting the bit inversion equal to or less than this minimum inversion width.

According to the embodiments of this invention described above, a timing with which a logic level inverts during one clock interval is detected from an input signal, a provisional identification result of identifying the input signal is corrected by effectively one clock identification error from this detection result, and the state transitions which can be obtained from the input signal based on this provisional identification result are limited, therefore maximum likelihood decoding can be performed by a simple construction.

Further, in the provisional identification result, when a logic level inversion occurs in an interval which is shorter than the logic level inversion interval permitted in the input signal, this logic level inversion interval is first corrected to the aforesaid permitted logic level inversion interval, and the state transitions which can be obtained from the input signal based on this provisional identification result are then limited so that maximum likelihood decoding can be performed by a simple construction.

What is claimed is:

1. A data decoding apparatus which receives an input signal produced by assigning an intercode interference every predetermined length unit of a digital signal having a binary logic level, and identifies the digital signal having a binary logic level from this input signal, comprising:

equalizing means for outputting an equalized signal by applying an equalization having predetermined equalization characteristics to said input signal, binarizing means for outputting a binary signal by binarizing said equalized signal, provisional identifying means for identifying the logic level of said binarized signal with an identifying error of effectively one clock of a clock signal based on said binarized signal, and outputting this identification result as a provisional identification result, correcting means for detecting a timing with which the logic level of said binarized signal inverts in one clock interval of said clock signal, and correcting said provisional identification result by this detection result, analog/digital conversion means for analog/digital conversion of said equalized signal, digital equalizing means for outputting a digital equalized signal by applying an equalization having equalization characteristics depending on said assigned intercode interference method to the output of said analog/digital conversion means, and identifying means for limiting the state transitions which can be obtained from the logic level of said digital equalized signal based on said provisional identification result corrected by said clock signal and said correcting means, detecting the most probable state transition from these limited state transitions, and identifying and outputting said digital signal from said digital equalized signal based on the detected state transition.

2. A data decoding apparatus as claimed in claim 1, wherein:

said identifying means limits the state transitions which can be obtained from said digital equalized signal to state transitions of said digital equalized signal corresponding to a logic level inversion in said provisional identification result, and state transitions of said digital equalized signal at a timing in which the logic level inversion is delayed by one clock period in said provisional identification result.

3. A data decoding apparatus as claimed in claim 1, wherein said identifying means comprises:

reference amplitude value outputting means for outputting a reference amplitude value of said digital equalized signal corresponding to said limited state transitions based on said provisional identification result, processing means for calculating a probability of said transitions by summing distances of said digital equalized signal from said reference amplitude value, determining said probability corresponding to a timing at which the transitions merge and determining said transitions, and history holding means for selectively transferring the history of said transitions based on the identification result of said probability processing means, and outputting the identification result of said digital equalizing means.

4. A data decoding apparatus as claimed in claim 3, wherein:

said probability processing means outputs the identification result of said probability by calculating a probability of one route by summing a distance from the reference amplitude value corresponding to n-1 successive bits of said provisional identification result relative to an interference code length n of said input signal, and updates the probability corresponding to the probability of said route according to the distance from the corresponding reference value when n successive bits of said provisional identification result are a predetermined logic level.

5. A data decoding apparatus as claimed in claim 1, wherein said identifying means comprises:

a first shift register which progressively transfers said provisional identification result, and a second shift register which progressively transfers a delay signal of said provisional identification result, and said identifying means exchanges the contents of said first and second shift registers based on said detected most probable state transition, and outputs an output signal of said first or second shift register as said identification result.

6. A data decoding apparatus which receives an input signal produced by assigning an intercede interference every predetermined length unit of a digital signal having a binary logic level, and identifies the digital signal having a binary logic level from this input signal, comprising:

equalizing means for outputting an equalized signal by applying an equalization having predetermined equalization characteristics to said input signal, binarizing means for outputting a binary signal by binarizing said equalized signal, provisional identifying means for identifying the logic level of said binarized signal with an identifying error of effectively one clock of a clock signal based on said binarized signal, and outputting this identification result as a provisional identification result, correcting means for correcting an interval in which said logic level inverts to a permitted logic level inversion interval when a logic level inversion occurs in said provisional identification result in a shorter interval than the logic level inversion interval permitted by said binary signal, analog/digital conversion means for analog/digital conversion of said equalized signal, digital equalizing means for outputting a digital equalized signal by applying an equalization having equalization characteristics depending on said assigned intercede interference method to the output of said analog/digital conversion means, and identifying means for limiting the state transitions which can be obtained from the logic level of said digital equalized signal based on said provisional identification result corrected by said clock signal and said correcting means, detecting the most probable state transition from these limited state transitions, and identifying and outputting said digital signal from said digital equalized signal based on the detected state transition.

7. A data decoding apparatus as claimed in claim 6, wherein:

said identifying means limits the state transitions which can be obtained from said digital equalized signal to state transitions of said digital equalized signal corresponding to a logic level inversion in said provisional identification result, and state transitions of said digital equalized signal at a timing in which the logic level inversion is delayed by one clock period in said provisional identification result.

8. A data decoding apparatus as claimed in claim 6, wherein said identifying means comprises:

reference amplitude value outputting means for outputting a reference amplitude value of said digital equalized signal corresponding to said limited state transitions based on said provisional identification result, processing means for calculating a probability of said transitions by summing distances of said digital equalized signal from said reference amplitude value, determining said probability corresponding to a timing at which the transitions merge and determining said transitions, and history holding means for selectively transferring the history of said transitions based on the identification result of said probability processing means, and outputting the identification result of said digital equalizing means.

9. A data decoding apparatus as claimed in claim 8, wherein:

said probability processing means outputs the identification result of said probability by calculating a probability of one route by summing a distance from the reference amplitude value corresponding to n-1 successive bits of said provisional identification result relative to an interference code length n of said input signal, and updates the probability corresponding to the probability of said route according to the distance from the corresponding reference value when n successive bits of said provisional identification result are a predetermined logic level.

10. A data decoding apparatus as claimed in claim 6, wherein said identifying means comprises:

a first shift register which progressively transfers said provisional identification result, and a second shift register which progressively transfers a delay signal of said provisional identification result, and said identifying means exchanges the contents of said first and second shift registers based on said detected most probable state transition, and outputs an output signal of said first or second shift register as said identification result.

11. A data decoding method wherein an input signal produced by assigning an intercode interference every predetermined length unit of a digital signal having a binary logic level is received, and the digital signal having a binary logic level is identified from this input signal, comprising:

an equalizing step for outputting an equalized signal by applying an equalization having predetermined equalization characteristics to said input signal, a binarizing step for outputting a binary signal by binarizing said equalized signal, a provisional identifying step for identifying the logic level of said binarized signal with an identifying error of effectively one clock of a clock signal based on said binarized signal, and outputting this identification result as a provisional identification result, a correcting step for detecting a timing with which the logic level of said binarized signal inverts in one clock interval of said clock signal, and correcting said provisional identification result by this detection result, an analog/digital conversion step for analog/digital conversion of said equalized signal, a digital equalizing step for outputting a digital equalized signal by applying an equalization having equalization characteristics depending on said assigned intercode interference method to the output of said analog/digital conversion step, and an identifying step for limiting the state transitions which can be obtained from the logic level of said digital equalized signal based on said provisional identification result corrected by said clock signal and said correcting step, detecting the most probable state transition from these limited state transitions, and identifying and outputting said digital signal from said digital equalized signal based on the detected state transition.

12. A data decoding method as claimed in claim 11, wherein:

said identifying step limits the state transitions which can be obtained from said digital equalized signal to state transitions of said digital equalized signal corresponding to a logic level inversion in said provisional identification result, and state transitions of said digital equalized signal at a timing in which the logic level inversion is delayed by one clock period in said provisional identification result.

13. A data decoding method as claimed in claim 11, wherein said identifying step comprises:

a reference amplitude value outputting step for outputting a reference amplitude value of said digital equalized signal corresponding to said limited state transitions based on said provisional identification result, a processing step for calculating a probability of said transitions by summing distances of said digital equalized signal from said reference amplitude value, determining said probability corresponding to a timing at which the transitions merge and determining said transitions, and a history holding step for selectively transferring the history of said transitions based on the identification result of said probability processing step, and outputting the identification result of said digital equalizing step.

14. A data decoding method as claimed in claim 13, wherein:

said probability processing step outputs the identification result of said probability by calculating a probability of one route by summing a distance from the reference amplitude value corresponding to n-1 successive bits of said provisional identification result relative to an interference code length n of said input signal, and updates the probability corresponding to the probability of said route according to the distance from the corresponding reference value when n successive bits of said provisional identification result are a predetermined logic level.

15. A data decoding method as claimed in claim 11, wherein:

said identifying step exchanges the contents of a first shift register which progressively transfers said provisional identification result and a second shift register which progressively transfers a delay signal of said provisional identification result, based on said detected most probable state transition, and outputs an output signal of said first or second shift register as said identification result.

16. A data decoding method wherein an input signal produced by assigning an intercode interference every predetermined length unit of a digital signal having a binary logic level is received, and the digital signal having a binary logic level is identified from this input signal, comprising:

an equalizing step for outputting an equalized signal by applying an equalization having predetermined equalization characteristics to said input signal, a binarizing step for outputting a binary signal by binarizing said equalized signal, a provisional identifying step for identifying the logic level of said binarized signal with an identifying error of effectively one clock of a clock signal based on said binarized signal, and outputting this identification result as a provisional identification result, a correcting step for correcting an interval in which said logic level inverts to a permitted logic level inversion interval when a logic level inversion occurs in said provisional identification result in a shorter interval than the logic level inversion interval permitted by said binary signal, an analog/digital conversion step for analog/digital conversion of said equalized signal, a digital equalizing step for outputting a digital equalized signal by applying an equalization having equalization characteristics depending on said assigned intercode interference method to the output of said analog/digital conversion step, and an identifying step for limiting the state transitions which can be obtained from the logic level of said digital equalized signal based on said provisional identification result corrected by said clock signal and said correcting step, detecting the most probable state transition from these limited state transitions, and identifying and outputting said digital signal from said digital equalized signal based on the detected state transition.

17. A data decoding method as claimed in claim 16, wherein:

said identifying step limits the state transitions which can be obtained from said digital equalized signal to state transitions of said digital equalized signal corresponding to a logic level inversion in said provisional identification result, and state transitions of said digital equalized signal at a timing in which the logic level inversion is delayed by one clock period in said provisional identification result.

18. A data decoding method as claimed in claim 16, wherein said identifying step comprises:

a reference amplitude value outputting step for outputting a reference amplitude value of said digital equalized signal corresponding to said limited state transitions based on said provisional identification result, a processing step for calculating a probability of said transitions by summing distances of said digital equalized signal from said reference amplitude value, determining said probability corresponding to a timing at which the transitions merge and determining said transitions, and a history holding step for selectively transferring the history of said transitions based on the identification result of said probability processing step, and outputting the identification result of said digital equalizing step.

19. A data decoding method as claimed in claim 18, wherein:

said probability processing step outputs the identification result of said probability by calculating a probability of one route by summing a distance from the reference amplitude value corresponding to n−1 successive bits of said provisional identification result relative to an interference code length n of said input signal, and updates the probability corresponding to the probability of said route according to the distance from the corresponding reference value when n successive bits of said provisional identification result are a predetermined logic level.

20. A data decoding method as claimed in claim 16, wherein said identifying step exchanges the contents of a first shift register which progressively transfers said provisional identification result and a second shift register which progressively transfers a delay signal of said provisional identification result, based on said detected most probable state transition, and outputs an output signal of said first or second shift register as said identification result.

* * * * *